United States Patent
Tsao et al.

(10) Patent No.: US 11,239,143 B2
(45) Date of Patent: *Feb. 1, 2022

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Pei-Haw Tsao, Taichung (TW); Tsung-Hsing Lu, Hsinchu County (TW); Li-Huan Chu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 249 days.

This patent is subject to a terminal disclaimer.

(21) Appl. No.: 16/532,216

(22) Filed: Aug. 5, 2019

(65) Prior Publication Data

US 2020/0098677 A1 Mar. 26, 2020

Related U.S. Application Data

(63) Continuation of application No. 16/196,677, filed on Nov. 20, 2018, now Pat. No. 10,373,901.

(60) Provisional application No. 62/736,993, filed on Sep. 26, 2018.

(51) Int. Cl.
*H01L 23/498* (2006.01)
*H05K 1/02* (2006.01)
*H01L 21/48* (2006.01)

(52) U.S. Cl.
CPC ...... *H01L 23/49822* (2013.01); *H01L 21/486* (2013.01); *H01L 21/4857* (2013.01); *H01L 23/49894* (2013.01); *H05K 1/0222* (2013.01)

(58) Field of Classification Search
CPC .......................... H01L 23/49822; H05K 1/0222
See application file for complete search history.

(56) References Cited

U.S. PATENT DOCUMENTS

| 10,373,901 B1* | 8/2019 | Tsao | H01L 21/4857 |
| 2010/0230789 A1* | 9/2010 | Yorita | H01L 23/3121 257/659 |
| 2012/0212384 A1 | 8/2012 | Kam et al. | |
| 2013/0223014 A1* | 8/2013 | Lin | H01L 23/49838 361/728 |
| 2014/0166353 A1* | 6/2014 | Roy | H05K 3/4647 174/262 |

(Continued)

OTHER PUBLICATIONS

Office Action from the Taiwanese Patent Office (TIPO) of Taiwanese patent application No. 108126370 dated Aug. 13, 2020.

*Primary Examiner* — Hung V Ngo
(74) *Attorney, Agent, or Firm* — WPAT, P.C., Intellectual Property Attorneys; Anthony King

(57) ABSTRACT

A semiconductor structure includes a first substrate including a first surface and a second surface opposite to the first surface; a first conductive via extended through the first substrate; a second conductive via extended through the first substrate; and a third conductive via extended through the first substrate, wherein the second conductive via is disposed between the first conductive via and the third conductive via, the second conductive via is configured to connect to a signal source, and the first conductive via and the third conductive via are configured to connect to an electrical ground.

20 Claims, 23 Drawing Sheets

(56) References Cited

U.S. PATENT DOCUMENTS

2017/0148714 A1  5/2017  Qian et al.

* cited by examiner

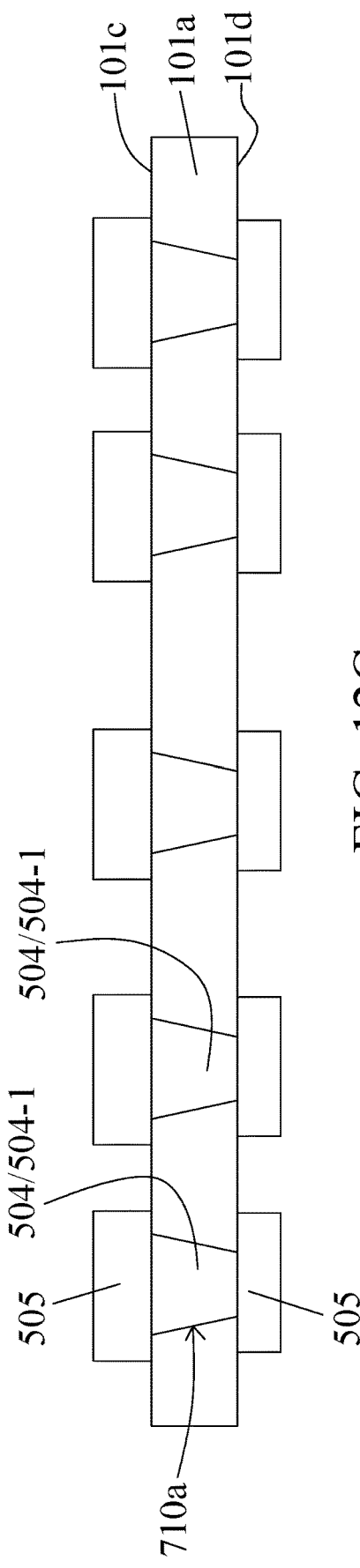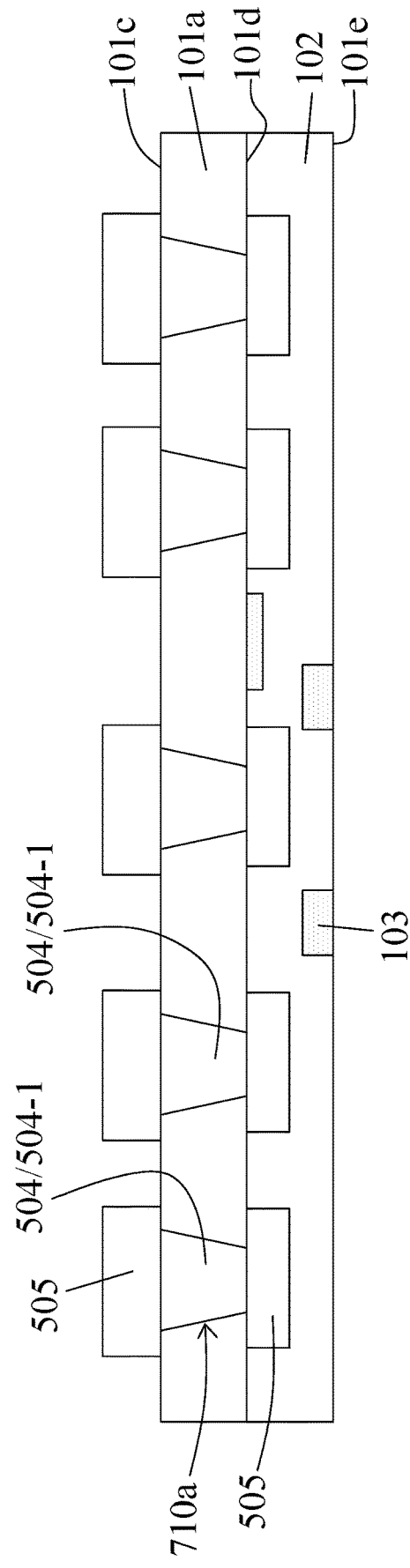
FIG. 12C
FIG. 12D

SEMICONDUCTOR STRUCTURE AND MANUFACTURING METHOD THEREOF

PRIORITY CLAIM AND CROSS-REFERENCE

This application is a continuation of U.S. patent application Ser. No. 16/196,677, entitled "Semiconductor Structure and Manufacturing Method Thereof" filed on Nov. 20, 2018 and claims the benefit of a provisional application Ser. No. 62/736,993 filed on Sep. 26, 2018, entitled "Semiconductor Structure and Manufacturing Method Thereof", the disclosure of which is hereby incorporated by reference in its entirety.

BACKGROUND

Semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, high noise level, delamination of components or other issues, resulting in a high yield loss of the semiconductor device. The semiconductor device is produced in an undesired configuration, which would further exacerbate materials wastage and thus increase the manufacturing cost.

As such, there is a continuous need to modify a structure of the semiconductor devices and improve the manufacturing operations of the semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 12A-12H are schematic views of manufacturing a semiconductor structure by a method of FIG. 12 in accordance with some embodiments of the present disclosure.

DETAILED DESCRIPTION OF THE DISCLOSURE

Figure 1:
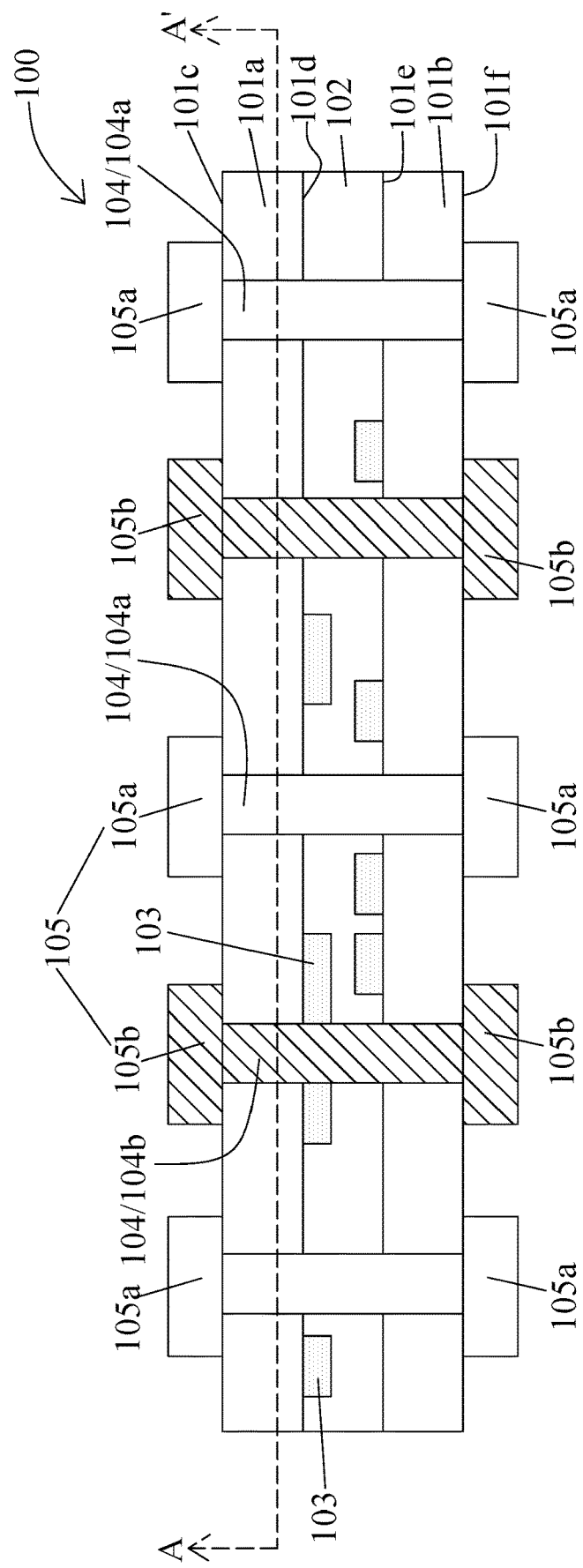
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, interconnect structures are formed through several layers of substrates. The interconnect structures connect electrical components disposed over or in the substrates. However, the semiconductor structure is small in size. As such, the interconnect structures are close to each other, and signal noise is generated from adjacent interconnect structures. The noise interferes signal transmission between electrical components across the substrates. As a result, performance of the semiconductor structure is adversely affected.

In the present disclosure, a semiconductor structure is disclosed. The semiconductor structure includes several substrates, a polymeric layer disposed between the substrates, and several conductive vias vertically extended through the substrates and the polymeric layer. Further, a method of manufacturing the semiconductor structure is disclosed. The method includes providing several substrates and a polymeric layer disposed between the substrates, forming several holes extended through the substrates and the polymeric layer, and disposing a conductive material to fill the holes and form several conductive vias.

Some of the conductive vias are configured to connect to a signal source, such as an input/output terminal or a node, and some of them are configured to connect to an electrical ground. Those conductive vias configured to connect to a signal source are surrounded by at least two conductive vias configured to connect to an electrical ground. Since each of the conductive vias configured to connect to a signal source is surrounded by several conductive vias configured to connect to an electrical ground, signal noise generated from adjacent conductive vias connected to a signal source can be minimized or prevented. The signal noise affecting signal transmission in the semiconductor structure can be reduced.

Figure 2:
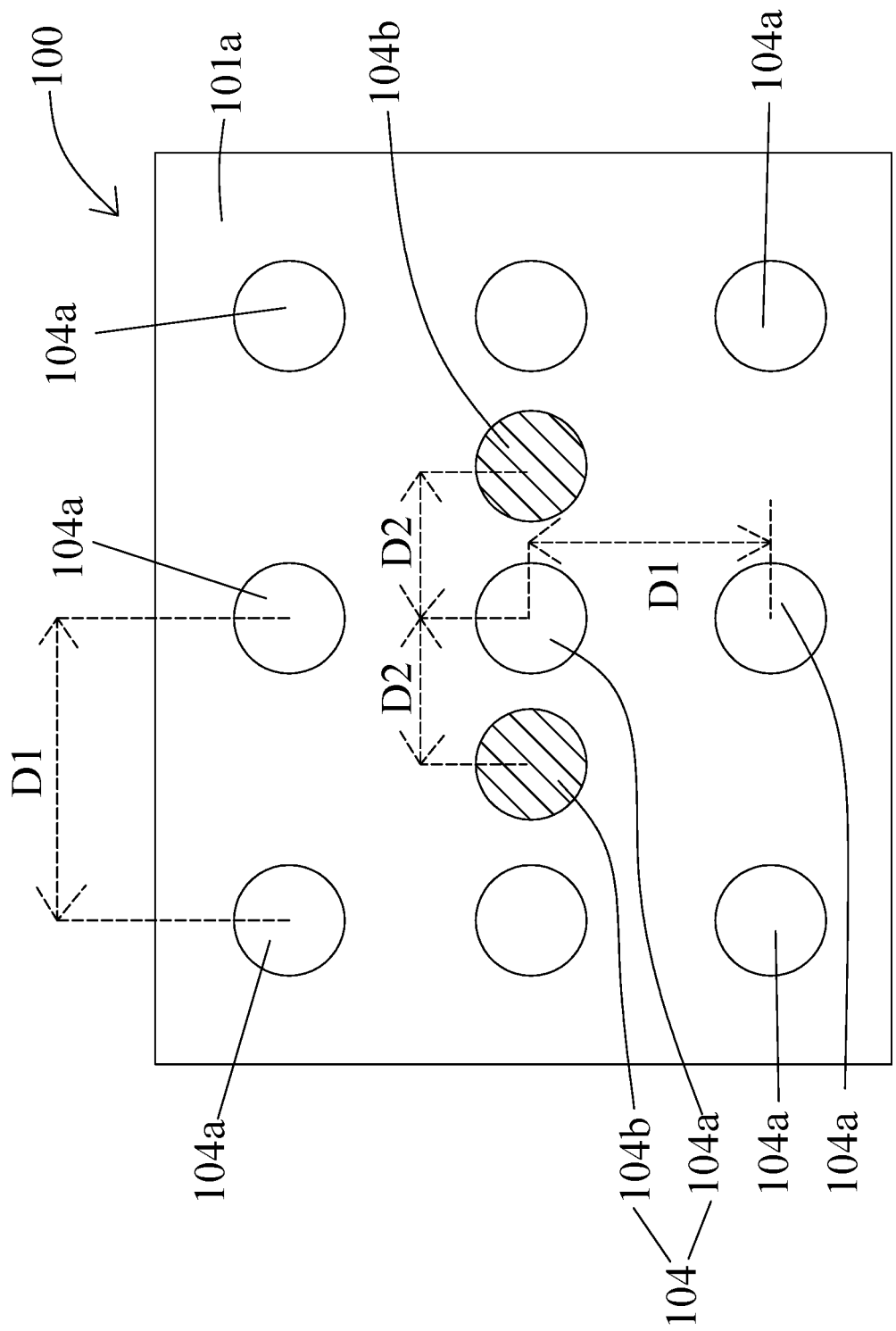
FIG. 2 is a schematic top cross sectional view of the semiconductor structure along AA' in FIG. 1.

FIG. 1 is a schematic cross sectional view of a semiconductor structure 100 in accordance with various embodiments of the present disclosure, and FIG. 2 is a schematic top cross sectional view of the semiconductor structure 100 along AA' in FIG. 1. In some embodiments, the semiconductor structure 100 includes a first substrate 101a, a second substrate 101b, a polymeric layer 102, several conductive lines 103, several conductive vias 104 and several conductive pads 105. In some embodiments, the semiconductor structure 100 is a part of a semiconductor package. In some embodiments, the semiconductor structure 100 is a printed circuit board (PCB).

In some embodiments, the first substrate 101a is a core substrate. In some embodiments, the first substrate 101a includes organic material. In some embodiments, the first substrate 101a includes ceramic. In some embodiments, the first substrate 101a includes fiberglass. In some embodiments, the first substrate 101a is non-conductive. In some embodiments, the first substrate 101a includes a first surface 101c and a second surface 101d opposite to the first surface 101c. In some embodiments, the first surface 101c is exposed to a surrounding.

In some embodiments, the second substrate 101b is a core substrate. In some embodiments, the second substrate 101b includes organic material. In some embodiments, the second substrate 101b includes ceramic. In some embodiments, the second substrate 101b includes fiberglass. In some embodiments, the second substrate 101b is non-conductive. In some embodiments, the second substrate 101b has similar configurations as the first substrate 101a. In some embodiments, the second substrate 101b includes a third surface 101e and a fourth surface 101f opposite to the third surface 101e. In some embodiments, the third surface 101e of the second substrate 101b faces the second surface 101d of the first substrate 101a.

In some embodiments, the polymeric layer 102 is disposed between the first substrate 101a and the second substrate 101b. In some embodiments, the polymeric layer 102 is disposed between the second surface 101d of the first substrate 101a and the third surface 101e of the second substrate 101b. In some embodiments, the polymeric layer 102 contacts with the second surface 101d of the first substrate 101a and the third surface 101e of the second substrate 101b. In some embodiments, the polymeric layer 102 includes resin, epoxy or prepreg. In some embodiments, the polymeric layer 102 includes dielectric material.

In some embodiments, the conductive line 103 is embedded in the polymeric layer 102. In some embodiments, the conductive line 103 is surrounded by the polymeric layer 102. In some embodiments, the conductive line 103 is extended within the polymeric layer 102. In some embodiments, the conductive line 103 is extended horizontally along the polymeric layer 102. In some embodiments, the conductive line 103 is extended over and along the first surface 101c of the first substrate 101a or the third surface 101e of the second substrate 101b. In some embodiments, the conductive line 103 is parallel to the first surface 101c, the second surface 101d, the third surface 101e and the fourth surface 101f.

In some embodiments, the conductive line 103 is configured to connect to a signal source such as an input/output terminal or a node. In some embodiments, the conductive line 103 is configured to connect to an electrical ground. In some embodiments, the conductive line 103 includes gold, silver, copper, nickel, tungsten, aluminum, titanium, palladium and/or alloys thereof.

In some embodiments, the conductive vias 104 are extended through the first substrate 101a, the second substrate 101b and the polymeric layer 102. In some embodiments, the conductive via 104 is electrically coupled with the conductive line 103. In some embodiments, the conductive via 104 is configured to connect to a signal source such as an input/output terminal or a node. In some embodiments, the conductive via 104 is configured to connect to an electrical ground. In some embodiments, the conductive vias 104 are extended vertically within the first substrate 101a, the second substrate 101b and the polymeric layer 102. In some embodiments, the conductive vias 104 are substantially orthogonal to the conductive line 103. In some embodiments, the conductive line 103 is disposed between two of the conductive vias 104. In some embodiments, the conductive vias 104 are substantially orthogonal to the first surface 101c, the second surface 101d, the third surface 101e and the fourth surface 101f. In some embodiments, the conductive vias 104 include gold, silver, copper, nickel, tungsten, aluminum, titanium, palladium and/or alloys thereof. In some embodiments, the conductive vias 104 are formed in holes filled with conductive material. In some embodiments, the conductive vias 104 are configured as plated through holes (PTH). In some embodiments, the conductive via 104 is integrally formed by a single operation, which will be discussed later.

In some embodiments, each of the conductive vias 104 is extended vertically through the first substrate 101a, the second substrate 101b and the polymeric layer 102 in a consistent width. In some embodiments as shown in FIG. 2, the conductive vias 104 are arranged in a rectangular array. In some embodiments, the conductive vias 104 are linearly aligned with each other.

In some embodiments, the conductive vias 104 include several first conductive vias 104a and several second conductive vias 104b. In some embodiments, the first conductive vias 104a are configured to connect to a signal source such as an input/output terminal or a node. In some embodiments, the second conductive vias 104b are configured to connect to an electrical ground or are grounded. In some embodiments, the conductive line 103 is disposed between the first conductive via 104a and the second conductive via 104b. In some embodiments, the second conductive vias 104b are disposed adjacent to one of the first conductive vias 104a. In some embodiments, the first conductive via 104a is disposed between at least two of the second conductive vias 104b. For example as shown in FIG. 2, one of the first conductive via 104a is disposed between two of the second conductive vias 104b.

In some embodiments, the first conductive vias 104a are spaced from each other in a first distance D1. In some embodiments, the first distance D1 is a distance between two centers of adjacent first conductive vias 104a. In some embodiments, the first conductive vias 104a are spaced from each other in a consistent pitch. In some embodiments, the second conductive via 104b is disposed away from the first conductive via 104a in a second distance D2. In some embodiments, the second distance D2 is a distance between a center of one of the first conductive vias 104a and a center of one of the second conductive vias 104b. In some embodiments, the second distance D2 is substantially less than the first distance D1. In some embodiments, the second distance D2 is about 0.5 to about 0.75 of the first distance D1.

In some embodiments, the conductive pads 105 are disposed over the first substrate 101a or the second substrate 101b. In some embodiments, the conductive pads 105 are disposed over the first surface 101c of the first substrate 101a or the fourth surface 101f of the second substrate 101b. In some embodiments, the conductive pads 105 are extended parallel to the first surface 101c of the first substrate 101a or the fourth surface 101f of the second substrate 101b. In some embodiments, the conductive pads 105 are exposed from the first substrate 101a and the second substrate 101b.

In some embodiments, the conductive pads 105 are electrically coupled with the conductive vias 104. In some embodiments, the conductive pads 105 contact with the conductive vias 104. In some embodiments, the conductive pads 105 are arranged in a rectangular array. In some embodiments, the conductive pads 105 are linearly aligned with each other. In some embodiments, the conductive pads 105 include gold, silver, copper, nickel, tungsten, aluminum, titanium, palladium and/or alloys thereof.

In some embodiments, the conductive pads 105 include several first conductive pads 105a and several second conductive pads 105b. In some embodiments, the first conductive pad 105a is electrically coupled with the first conductive via 104a, and the second conductive pad 105b is electrically coupled with the second conductive via 104b. In some embodiments, the first conductive pad 105a is configured to connect to a signal source such as an input/output terminal or a node. In some embodiments, the second conductive pad 105b is configured to connect to an electrical ground.

In some embodiments, the second conductive pads 105b are disposed adjacent to one of the first conductive pads 105a. In some embodiments, the first conductive pad 105a is disposed between at least two of the second conductive pads 105b. In some embodiments, two first conductive pads 105a are disposed at both ends of the first conductive via 104a respectively. In some embodiments, the second conductive pads 105b are disposed at both ends of the second conductive via 104b respectively. In some embodiments, the first conductive via 104a between the first conductive pads 105a is in a consistent width. In some embodiments, the second conductive via 104b between the second conductive pads 105b is in a consistent width.

In some embodiments, the first conductive pads 105a are spaced from each other in the first distance D1. In some embodiments, the first conductive pads 105a are spaced from each other in the consistent pitch. In some embodiments, the second conductive pad 105b is disposed away from the first conductive pad 105a in the second distance D2. In some embodiments, the second distance D2 is substantially less than the first distance D1. In some embodiments, the second distance D2 is about 0.5 to about 0.75 of the first distance D1.

Figure 3:
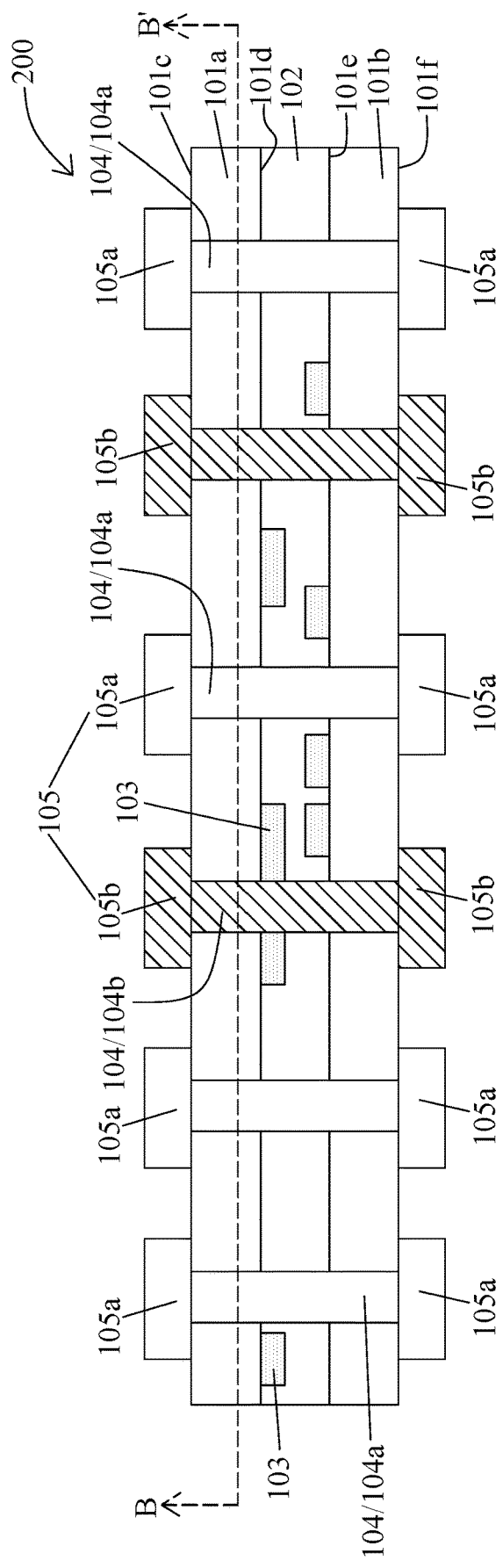
FIG. 3 is a schematic cross sectional view of a semiconductor structure in accordance with some embodiments of the present disclosure.
Figure 4:
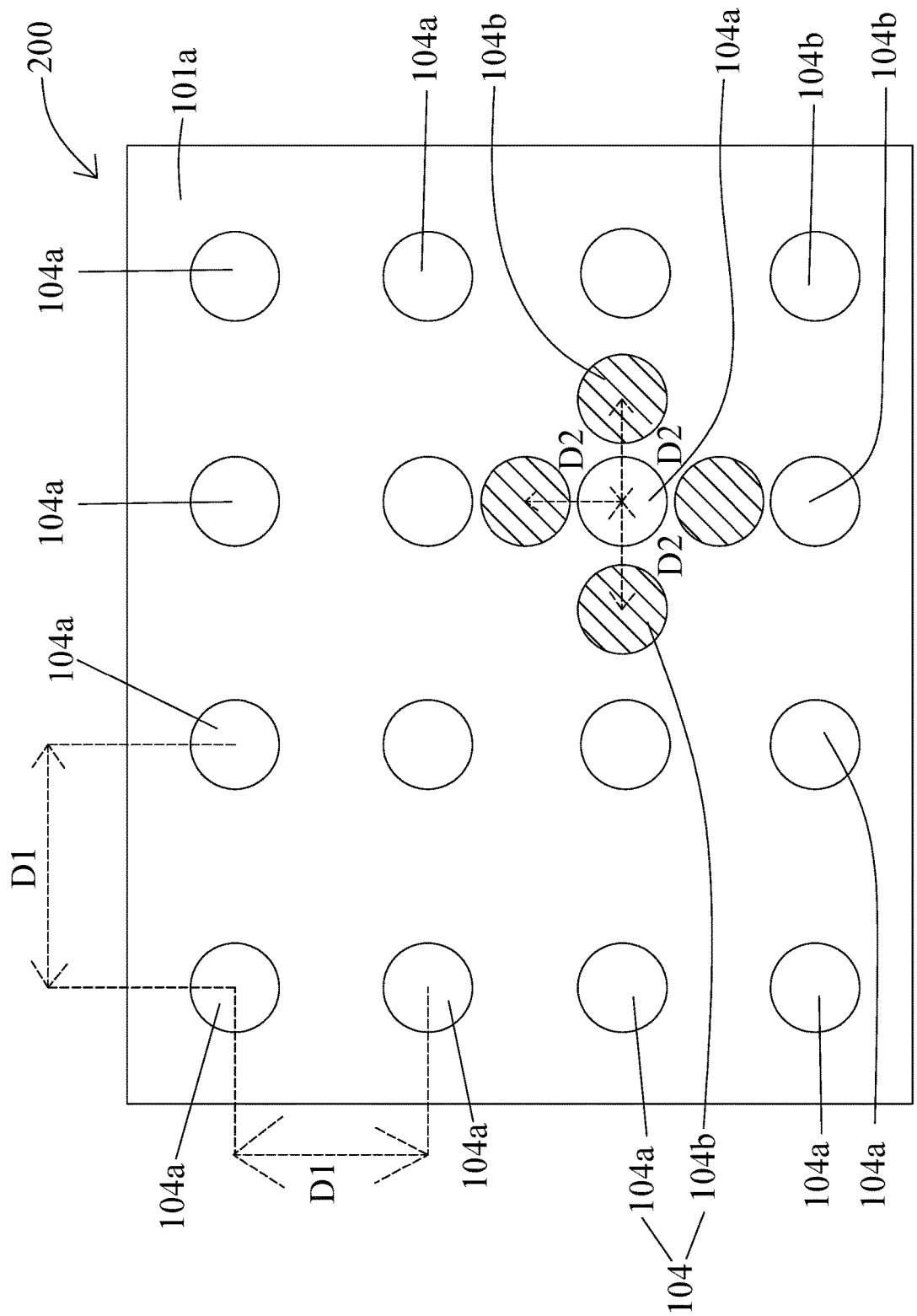
FIG. 4 is a schematic top cross sectional view of the semiconductor structure along BB' in FIG. 3.

FIG. 3 is a schematic cross sectional view of a semiconductor structure 200 in accordance with various embodiments of the present disclosure, and FIG. 4 is a schematic top cross sectional view of the semiconductor structure 200 along BB' in FIG. 3. In some embodiments, the semiconductor structure 200 includes a first substrate 101a, a second substrate 101b, a polymeric layer 102, several conductive lines 103, several conductive vias 104 and several conductive pads 105, which have similar configurations as those described above or shown in FIGS. 1 and 2.

In some embodiments, the conductive vias 104 include several first conductive vias 104a and several second conductive vias 104b. In some embodiments, the first conductive vias 104a are configured to connect to a signal source such as an input/output terminal or a node. In some embodiments, the second conductive vias 104b are configured to connect to an electrical ground. In some embodiments, one of the first conductive vias 104a is surrounded by more than two of the second conductive vias 104b. In some embodiments as shown in FIG. 4, one first conductive via 104a is surrounded by four second conductive vias 104b.

In some embodiments, the first conductive vias 104a are spaced from each other in a first distance D1. In some embodiments, each of the second conductive vias 104b is disposed away from the first conductive via 104a surrounded by the second conductive vias 104b in a second distance D2. In some embodiments, the second distance D2 is substantially less than the first distance D1. In some embodiments, the second distance D2 is about 0.5 to about 0.75 of the first distance D1.

In some embodiments, the conductive pads 105 include several first conductive pads 105a and several second conductive pads 105b. In some embodiments, the first conductive pad 105a is electrically coupled with the first conductive via 104a, and the second conductive pad 105b is electrically coupled with the second conductive via 104b. In some embodiments, the first conductive pad 105a is configured to connect to a signal source such as an input/output terminal or a node. In some embodiments, the second conductive pad 105b is configured to connect to an electrical ground.

In some embodiments, the second conductive pads 105b surrounds one of the first conductive pads 105a. In some embodiments, four second conductive pads 105b surround one first conductive pad 105a. In some embodiments, the first conductive pads 105a are spaced from each other in the first distance D1. In some embodiments, the second conductive pad 105b is disposed away from the first conductive pad 105a surrounded by the second conductive pads 105b in the second distance D2. In some embodiments, the second distance D2 is substantially less than the first distance D1. In some embodiments, the second distance D2 is about 0.5 to about 0.75 of the first distance D1.

Figure 5:
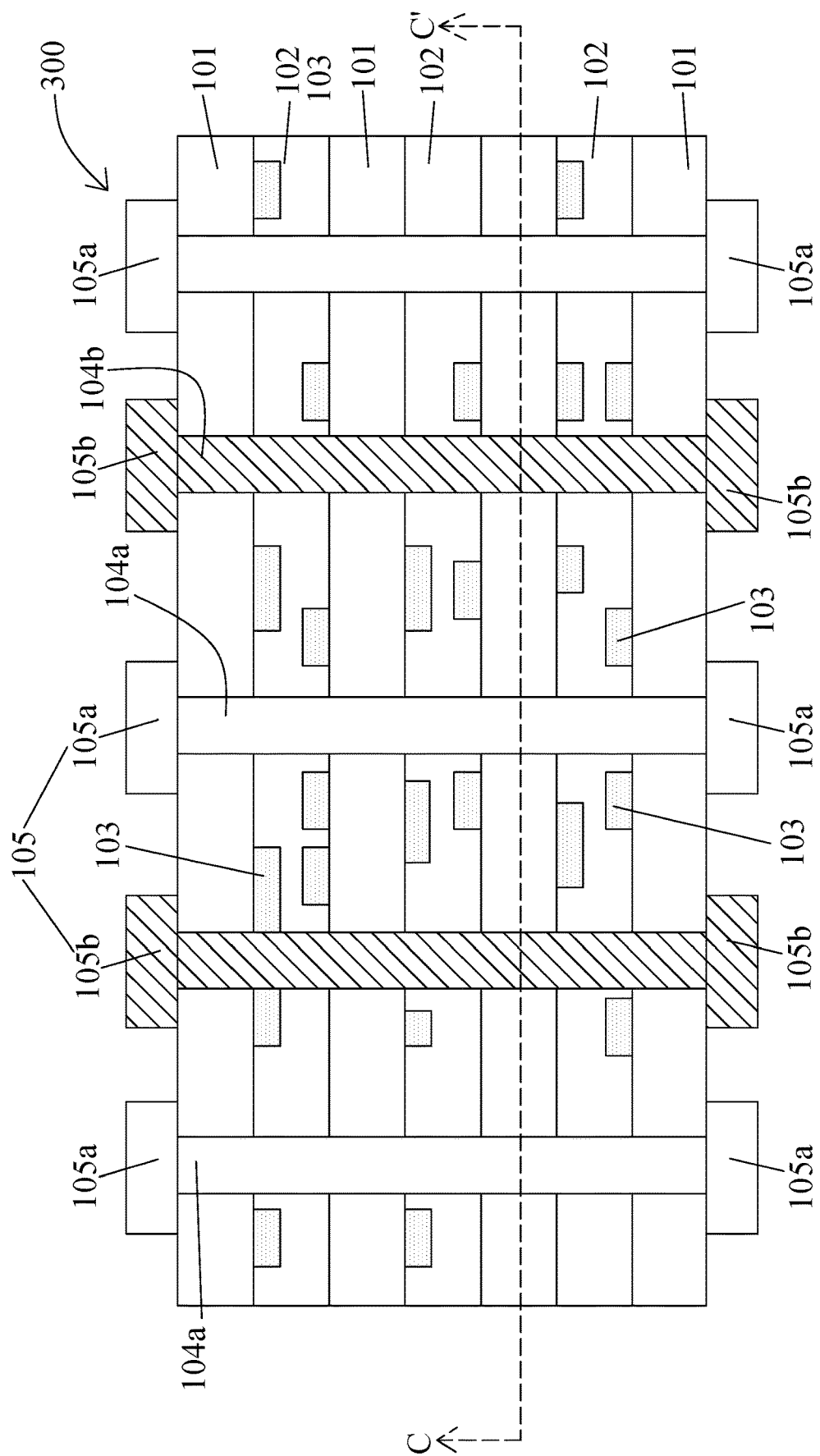
FIG. 5 is a schematic cross sectional view of a semiconductor structure in accordance with some embodiments of the present disclosure.
Figure 6:
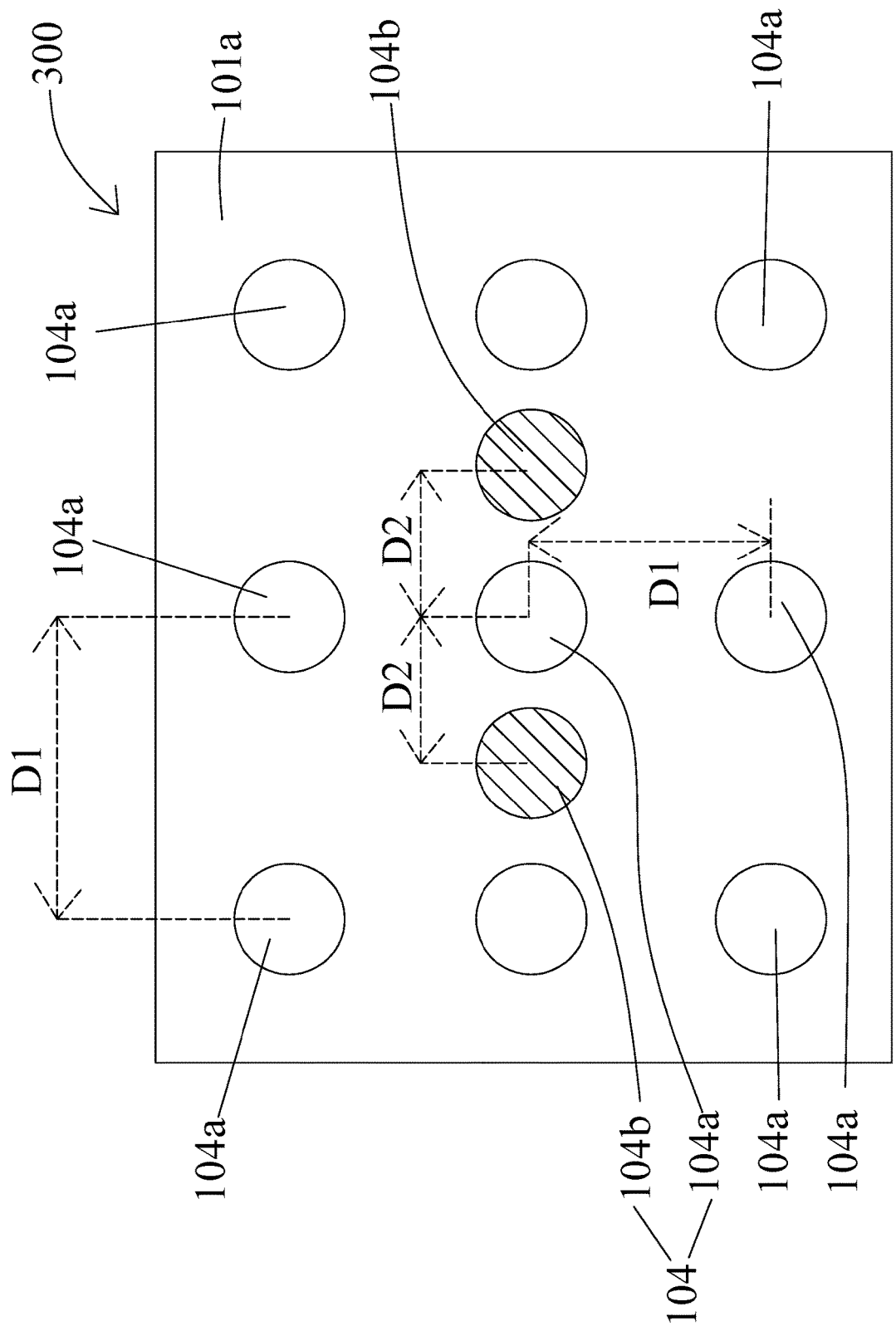
FIG. 6 is a schematic top cross sectional view of the semiconductor structure along CC' in FIG. 5.

FIG. 5 is a schematic cross sectional view of a semiconductor structure 300 in accordance with various embodiments of the present disclosure, and FIG. 6 is a schematic top cross sectional view of the semiconductor structure 300 along CC' in FIG. 5. In some embodiments, the semiconductor structure 300 includes several substrates 101, several polymeric layers 102, several conductive lines 103, several conductive vias 104 and several conductive pads 105, which have similar configurations as those described above or shown in FIGS. 1 and 2.

In some embodiments, the conductive vias 104 include several first conductive vias 104a and several second conductive vias 104*b*. In some embodiments, the first conductive vias 104*a* are configured to connect to a signal source such as an input/output terminal or a node. In some embodiments, the second conductive vias 104*b* are configured to connect to an electrical ground. In some embodiments, one of the first conductive vias 104*a* is surrounded by more than two of the second conductive vias 104*b*. In some embodiments as shown in FIG. 6, one first conductive via 104*a* is surrounded by two second conductive vias 104*b*. In some embodiments, the first conductive vias 104*a* are spaced from each other in a first distance D1. In some embodiments, each of the second conductive vias 104*b* is disposed away from the first conductive via 104*a* surrounded by the second conductive vias 104*b* in a second distance D2. In some embodiments, the second distance D2 is substantially less than the first distance D1. In some embodiments, the second distance D2 is about 0.5 to about 0.75 of the first distance D1.

In some embodiments, the substrates 101 and the polymeric layers 102 are disposed alternately. In some embodiments, each of the conductive vias 104 is extended through the substrates 101 and the polymeric layers 102. In some embodiments, each of the conductive vias 104 is vertically extended in a consistent width. In some embodiments, the conductive pads 105 are disposed over one of the substrates 101 and exposed from the substrates 101.

Figure 7:
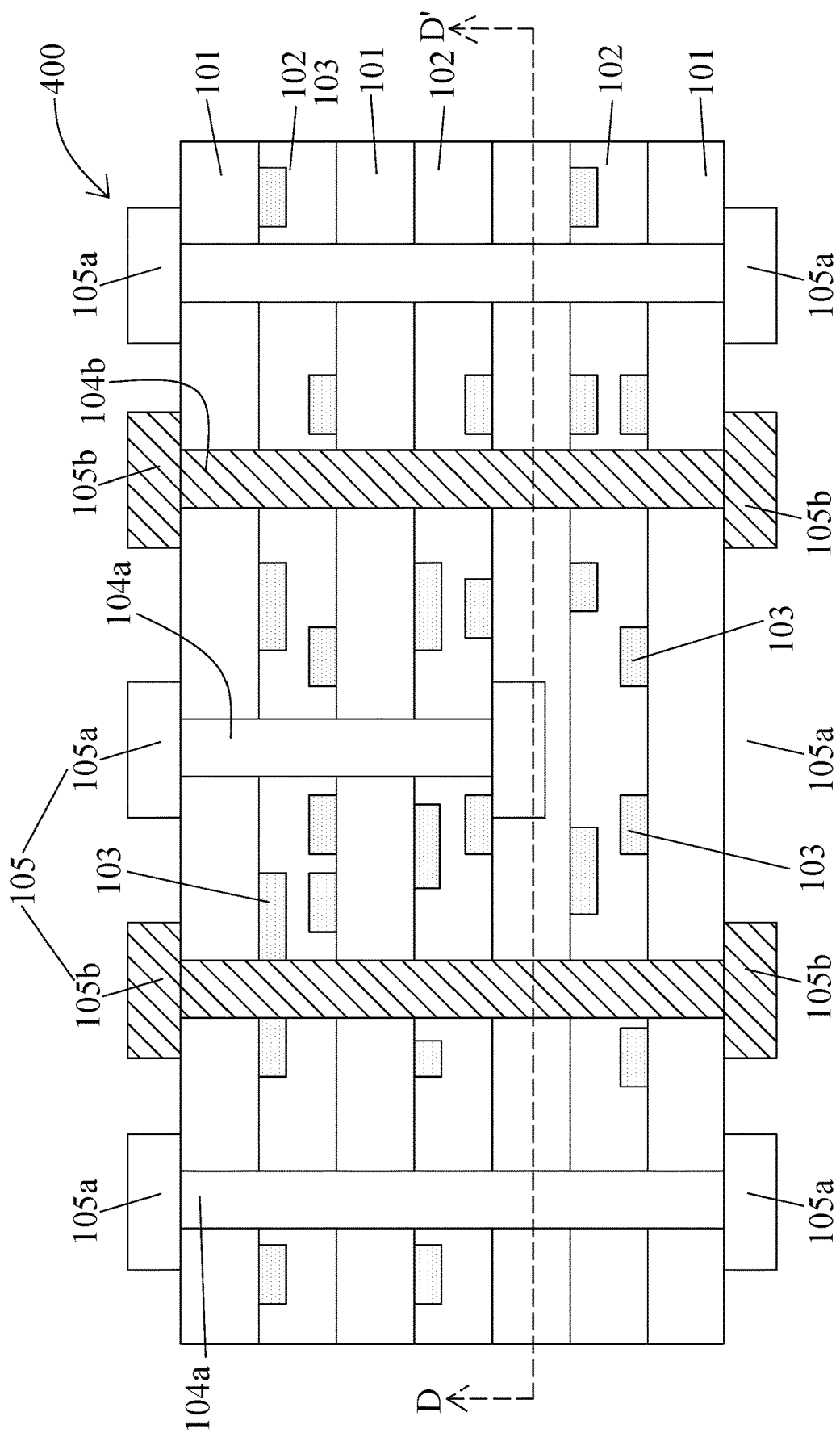
FIG. 7 is a schematic cross sectional view of a semiconductor structure in accordance with some embodiments of the present disclosure.
Figure 8:
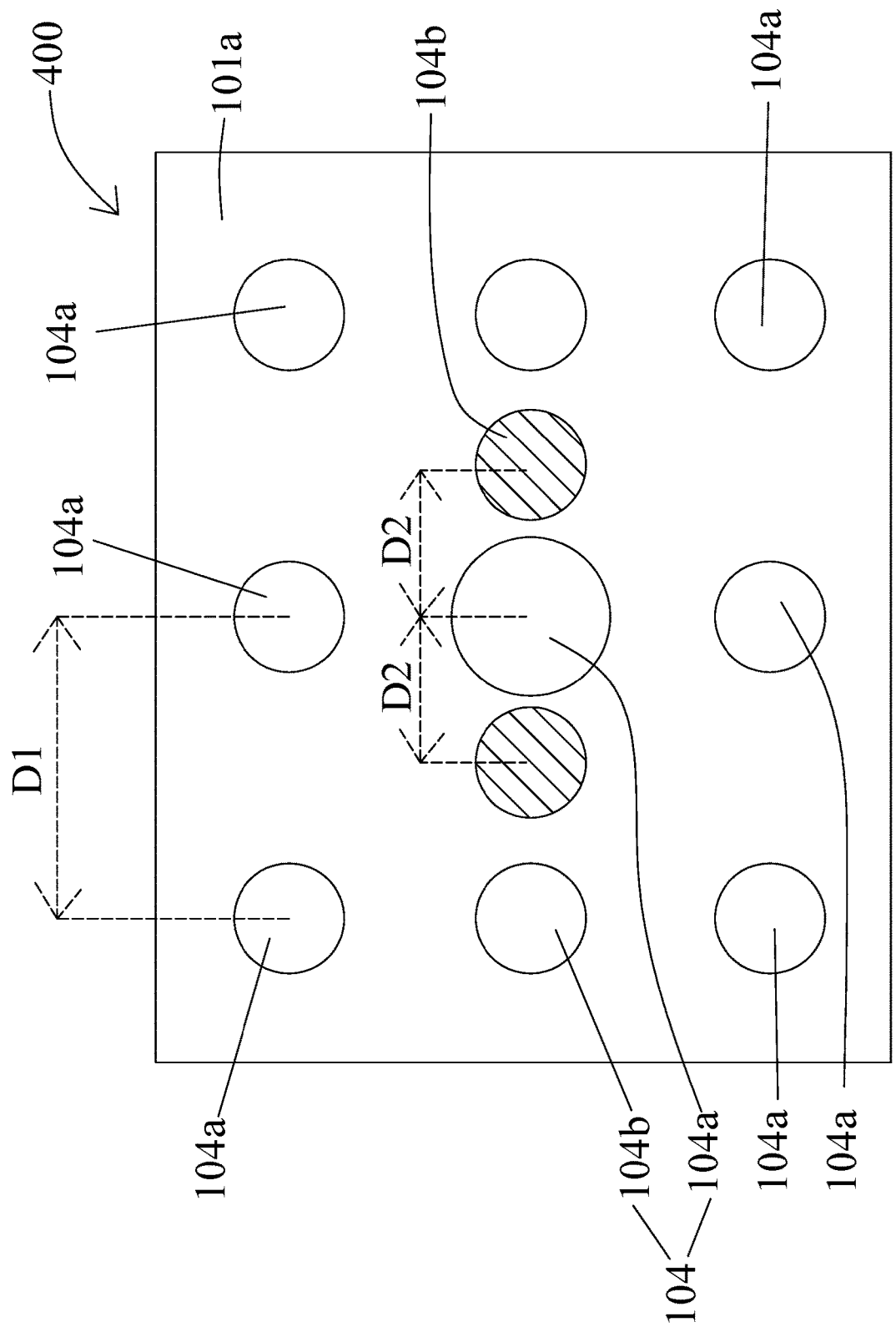
FIG. 8 is a schematic top cross sectional view of the semiconductor structure along DD' in FIG. 7.

FIG. 7 is a schematic cross sectional view of a semiconductor structure 400 in accordance with various embodiments of the present disclosure, and FIG. 8 is a schematic top cross sectional view of the semiconductor structure 400 along DD' in FIG. 7. In some embodiments, the semiconductor structure 400 includes several substrates 101, several polymeric layers 102, several conductive lines 103, several conductive vias 104 and several conductive pads 105, which have similar configurations as those described above or shown in FIGS. 5 and 6.

In some embodiments, some of the conductive vias 104 are extended through all of the substrates 101 and all of the polymeric layers 102, and some of the conductive vias 104 are extended through only some of the substrates 101 or some of the polymeric layers 102. In some embodiments, the first conductive via 104*a* configured to connect to a signal source is extended through some of the substrates 101 or some of the polymeric layers 102. In some embodiments, the second conductive via 104*b* configured to connect to an electrical ground is extended through all of the substrates 101 and all of the polymeric layers 102. In some embodiments, an end of one of the first conductive vias 104*a* is embedded in one of the substrates 101 or one of the polymeric layers 102. In some embodiments, one of the first conductive pads 105*a* disposed at the end of one of the first conductive vias 104*a* is embedded in one of the substrates 101 or one of the polymeric layers 102.

In some embodiments, the first conductive pad 105*a* and the second conductive pad 105*b* are disposed at the same level. In some embodiments, the first conductive pad 105*a* is substantially coplanar with the second conductive pad 105*b*. In some embodiments, the first conductive pad 105*a* and the second conductive pad 105*b* are exposed. In some embodiments, the first conductive pad 105*a* and the second conductive pad 105*b* are disposed over the substrate 101.

In some embodiments, the first conductive pad 105*a* and the second conductive pad 105*b* are disposed at different levels. In some embodiments, the first conductive pad 105*a* is not coplanar with the second conductive pad 105*b*. In some embodiments, the first conductive pad 105*a* is not exposed and is at a level different from the second conductive pad 105*b*. In some embodiments, the second conductive pad 105*b* is not exposed and is at a level different from the first conductive pad 105*a*. In some embodiments, the first conductive pad 105*a* is not disposed over the substrate 101. In some embodiments, the second conductive pad 105*b* is not disposed over the substrate 101. In some embodiments, the first conductive pad 105*a* is embedded in the substrate 101 or the polymeric layer 102. In some embodiments, the second conductive pad 105*b* is embedded in the substrate 101 or the polymeric layer 102.

Figure 9:
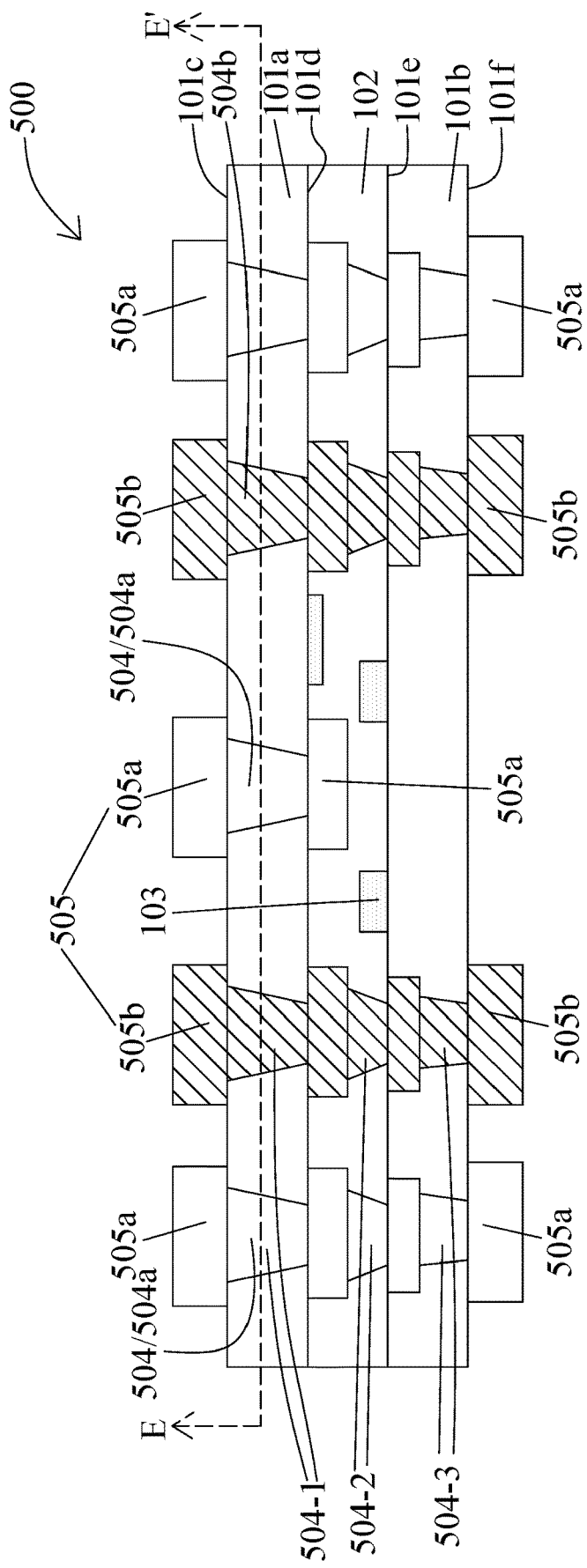
FIG. 9 is a schematic cross sectional view of a semiconductor structure in accordance with some embodiments of the present disclosure.
Figure 10:
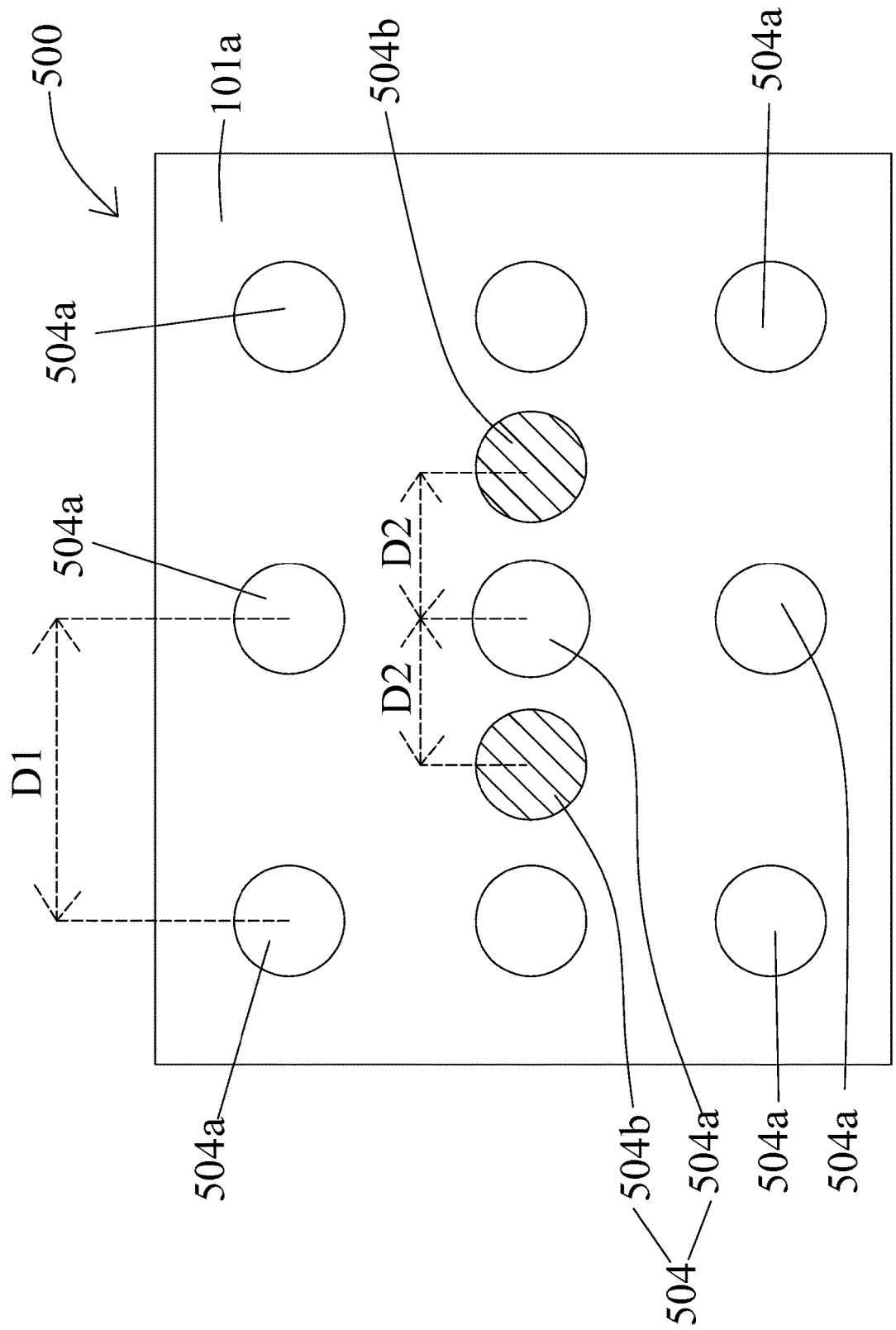
FIG. 10 is a schematic top cross sectional view of the semiconductor structure along EE' in FIG. 9.

FIG. 9 is a schematic cross sectional view of a semiconductor structure 500 in accordance with various embodiments of the present disclosure, and FIG. 10 is a schematic top cross sectional view of the semiconductor structure 500 along EE' in FIG. 9. In some embodiments, the semiconductor structure 500 includes a first substrate 101*a*, a second substrate 101*b*, a polymeric layer 102 and several conductive lines 103, which have similar configurations as those described above or shown in FIGS. 1 and 2. In some embodiments, the semiconductor 500 includes several conductive vias 504 and several conductive pads 505.

In some embodiments, the conductive vias 504 are configured as stacked vias as shown in FIG. 9. In some embodiments, the conductive via 504 includes several vias (504-1, 504-2 and 504-3) stacking over each other. In some embodiments, the conductive via 504 is separately formed by more than one operations, which will be discussed later. In some embodiments, the conductive via 504 includes a first via 504-1, a second via 504-2 and a third via 504-3. In some embodiments, the first via 504-1, the second via 504-2 and the third via 504-3 are separately formed. In some embodiments, each of the vias (504-1, 504-2 and 504-3) of the conductive via 504 is extended through the first substrate 101*a*, the second substrate 101*b* or the polymeric layer 102. In some embodiments, the conductive pad 505 is disposed at an end of the conductive via 504. In some embodiments, the conductive pad 505 is disposed over the first substrate 101*a* or under the second substrate 101*b*. In some embodiments, the conductive pad 505 has similar configurations as the conductive pad 105 described above or shown in FIGS. 1 and 2.

Figure 11:
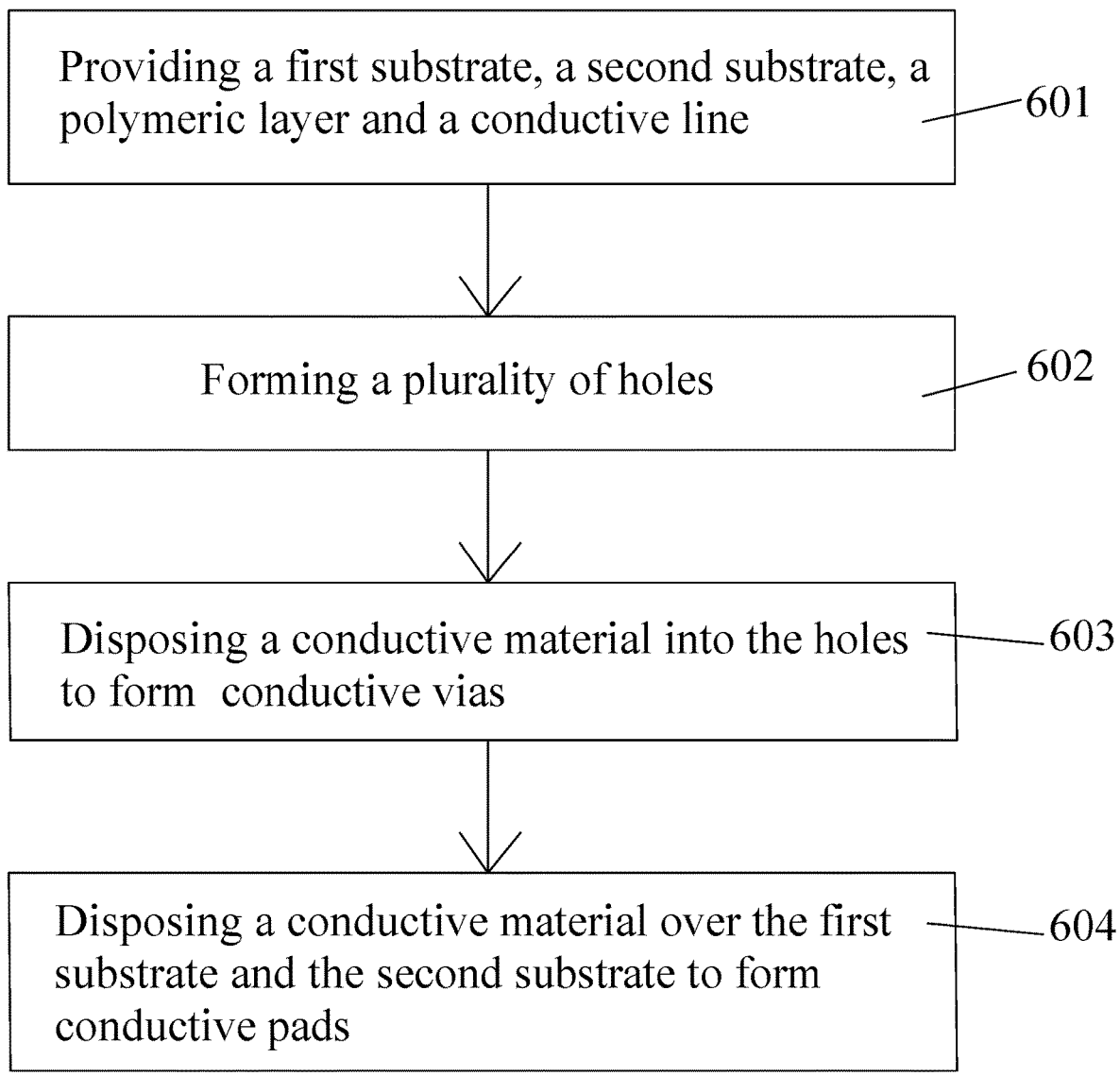
FIG. 11 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method 600. The method 600 includes a number of operations and the description and illustration are not deemed as a limitation as the sequence of the operations. FIG. 11 is an embodiment of the method 600 of manufacturing a semiconductor structure. The method 600 includes a number of operations (601, 602, 603 and 604).

Figure 11A:
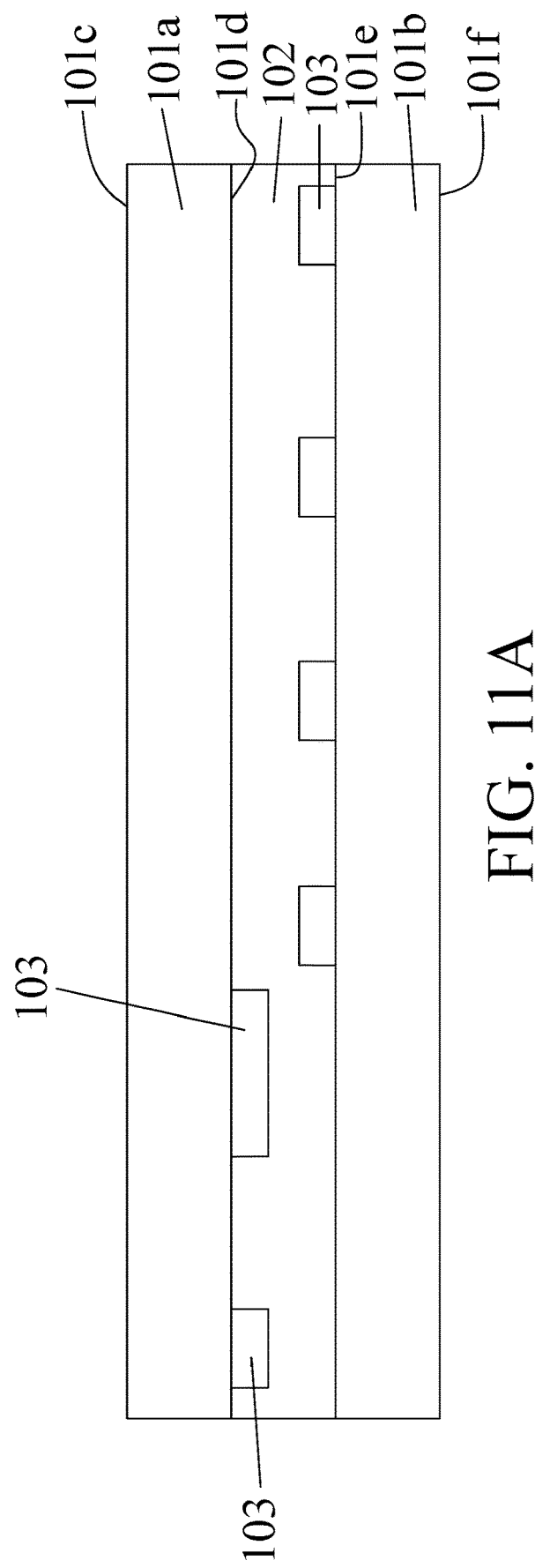
FIGS. 11A-11E are schematic views of manufacturing a semiconductor structure by a method of FIG. 11 in accordance with some embodiments of the present disclosure.

In operation 601, a first substrate 101*a*, a second substrate 101*b*, a polymeric layer 102 and a conductive line 103 are provided as shown in FIG. 11A. In some embodiments, the polymeric layer 102 is disposed between the first substrate 101*a* and the second substrate 101*b*. In some embodiments, the first substrate 101*a* is bonded with the second substrate 101*b* by the polymeric layer 102. In some embodiments, first substrate 101*a* is bonded with the second substrate 101*b* by disposing the polymeric layer 102 between the first substrate 101*a* and the second substrate 101*b* and then hot pressing the first substrate 101*a* towards the second substrate 101*b* or vice versa.

In some embodiments, the first substrate 101*a* includes a first surface 101*c* and a second surface 101*d* opposite to the first surface 101*c*. In some embodiments, the second substrate 101*b* includes a third surface 101*e* and a fourth surface 101*f* opposite to the third surface 101*e*. In some embodiments, the polymeric layer 102 is disposed between the second surface 101*d* of the first substrate 101*a* and the third surface 101*e* of the second substrate 101*b*.

In some embodiments, the conductive line 103 is embedded in the polymeric layer 102. In some embodiments, the conductive line 103 is extended horizontally along the polymeric layer 102. In some embodiments, the conductive line 103 is formed by removing some portions of the polymeric layer 102 and then disposing conductive material over the polymeric layer 102. In some embodiments, the removal of some portions of the polymeric layer 102 includes etching or any other suitable operations. In some embodiments, the conductive material is disposed by sputtering, electroplating or any other suitable operations. In some embodiments, the first substrate 101*a*, the second substrate 101*b*, the polymeric layer 102 and the conductive line 103 have similar configurations as those described above or shown in FIGS. 1-10.

Figure 11B:
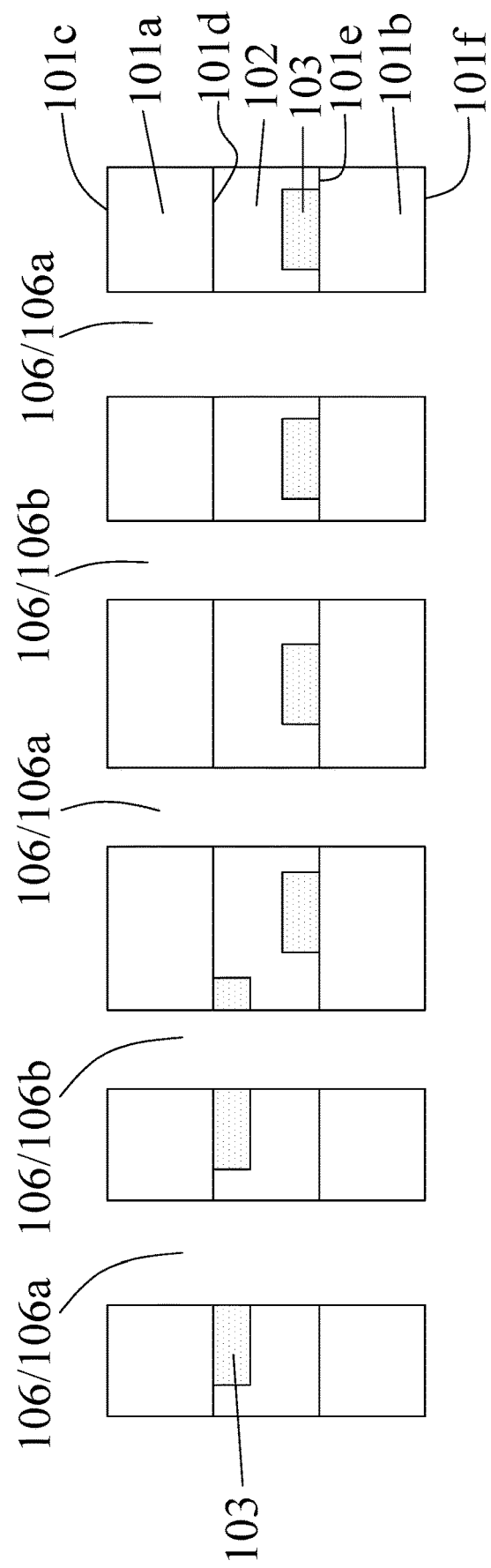

In operation 602, several holes 106 are formed as shown in FIG. 11B. In some embodiments, the holes 106 are extended through the first substrate 101*a*, the second substrate 101*b* and the polymeric layer 102. In some embodiments, the holes 106 are substantially orthogonal to the conductive line 103. In some embodiments, the hole 106 is formed by removing a portion of the first substrate 101*a*, a portion of the second substrate 101*b* and a portion of the polymeric layer 102. In some embodiments, the hole 106 is formed by laser drilling or any other suitable operations. In some embodiments, the hole 106 is formed by a single operation. In some embodiments, the holes 106 include several first holes 106*a* and several second holes 106*b*.

Figure 11C:
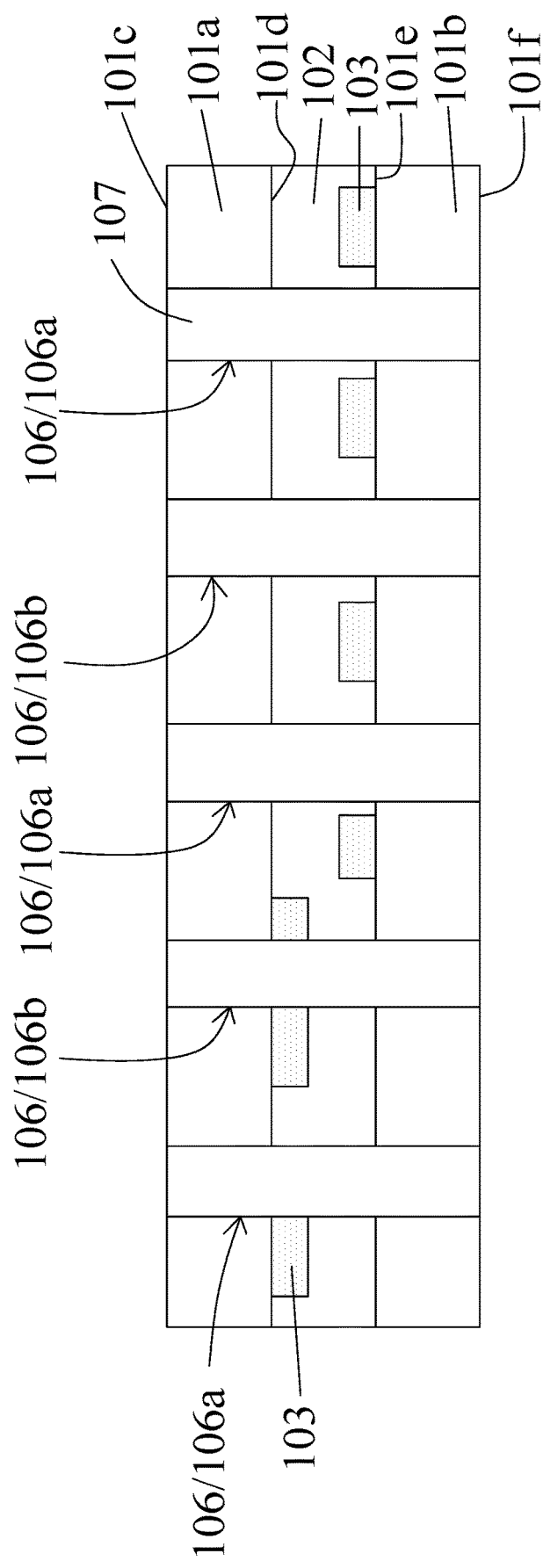

In operation 603, a conductive material 107 is disposed into the holes 106 to form several conductive vias 104 as shown in FIG. 11C. In some embodiments, the conductive material 107 is disposed into the first holes 106*a* and the second holes 106*b*. In some embodiments, the conductive via 104 is integrally formed by a single operation. In some embodiments, the disposing of the conductive material 107 includes sputtering, electroplating or any other suitable operations. In some embodiments, the conductive material 107 includes gold, silver, copper, nickel, tungsten, aluminum, titanium, palladium and/or alloys thereof.

In some embodiments, the conductive vias 104 include several first conductive vias 104*a* and several second conductive vias 104*b*. In some embodiments, the first conductive vias 104*a* are configured to connect to a signal source such as an input/output terminal or a node. In some embodiments, the second conductive vias 104*b* are configured to connect to an electrical ground or are grounded. In some embodiments, the second conductive vias 104*b* are disposed adjacent to one of the first conductive vias 104*a*. In some embodiments, the first conductive via 104*a* is disposed between at least two of the second conductive vias 104*b*.

Figure 11D:
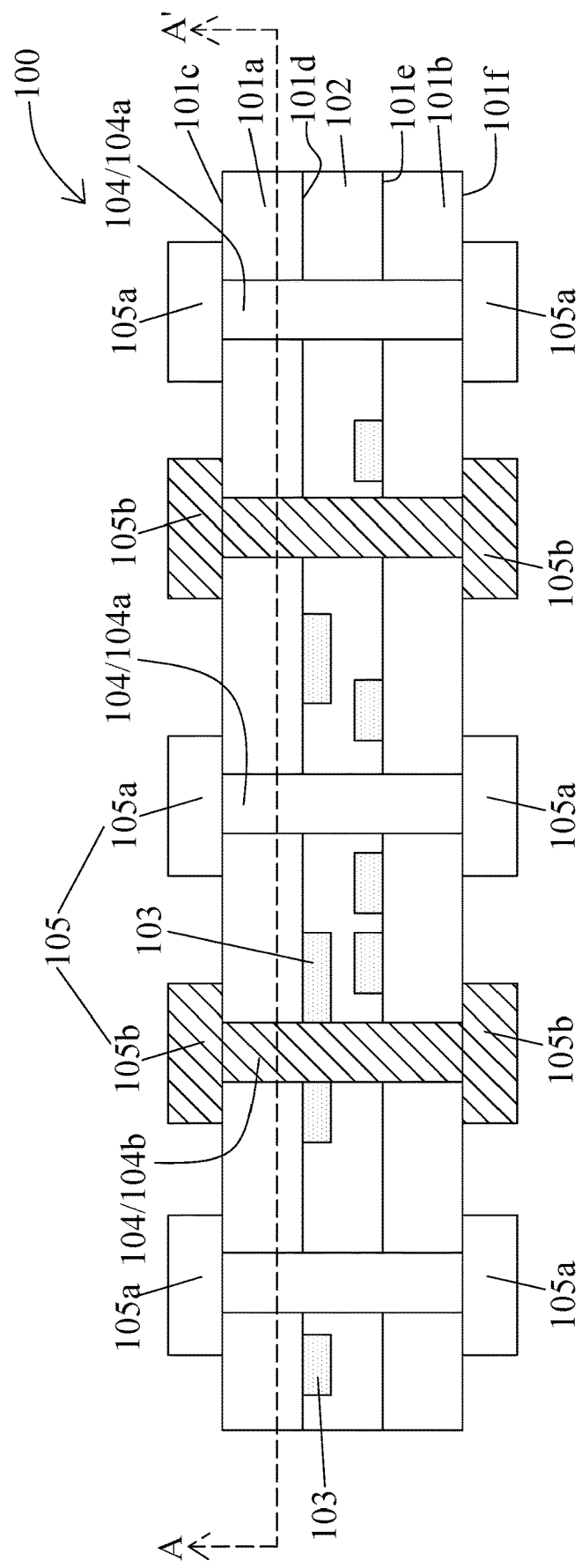

In operation 604, a conductive material is disposed over the first substrate 101*a* and the second substrate 101*b* to form conductive pads 105 as shown in FIG. 11D. In some embodiments, the conductive material is disposed over the first surface 101*c* of the first substrate 101*a* and the fourth surface 101*f* of the second substrate 101*b*. In some embodiments, the disposing of the conductive material includes sputtering, electroplating or any other suitable operations. In some embodiments, the conductive material includes gold, silver, copper, nickel, tungsten, aluminum, titanium, palladium and/or alloys thereof. In some embodiments, the conductive pads 105 are disposed over the first substrate 101*a* or the second substrate 101*b*. In some embodiments, the conductive pads 105 are disposed over the first surface 101*c* of the first substrate 101*a* or the fourth surface 101*f* of the second substrate 101*b*. In some embodiments, the conductive pads 105 are electrically coupled with the conductive vias 104. In some embodiments, the conductive pads 105 include several first conductive pads 105*a* and several second conductive pads 105*b*. In some embodiments, the first conductive pad 105*a* is electrically coupled with the first conductive via 104*a*, and the second conductive pad 105*b* is electrically coupled with the second conductive via 104*b*. In some embodiments, the first conductive pad 105*a* is configured to connect to a signal source such as an input/output terminal or a node. In some embodiments, the second conductive pad 105*b* is configured to connect to an electrical ground.

In some embodiments, the first conductive via 104*a*, the second conductive via 104*b*, the first conductive pad 105*a* and the second conductive pad 105*b* have similar configurations as those described above or shown in FIGS. 1-10. In some embodiments, a semiconductor structure 100 as described above or shown in FIGS. 1-2 is formed.

Figure 11E:
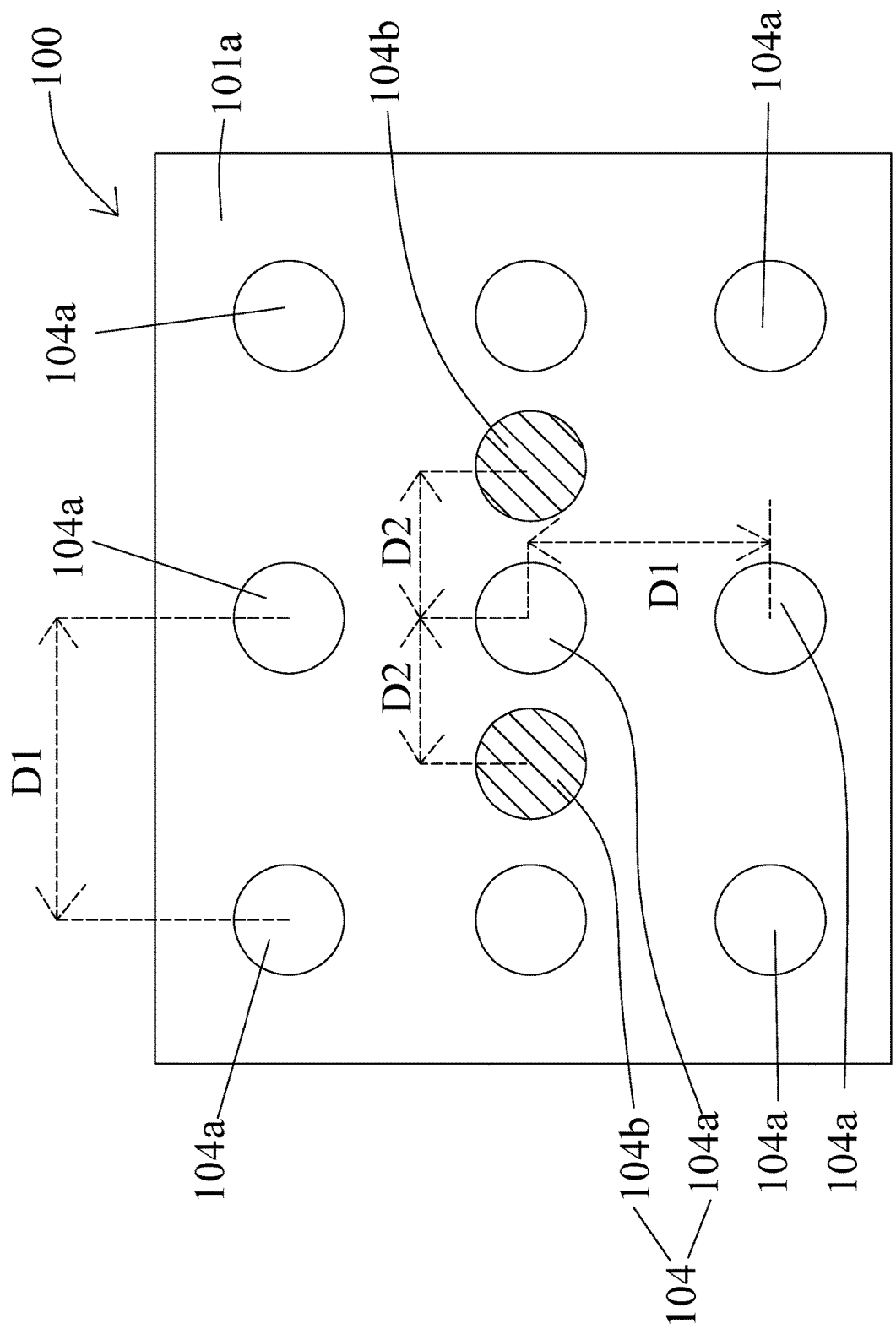

FIG. 11E is a schematic top cross sectional view of the semiconductor structure 100 along AA' in FIG. 11D. In some embodiments, the first holes 106*a* are spaced from each other in a first distance D1. In some embodiments, the first distance D1 is a distance between two centers of adjacent first holes 106*a*. In some embodiments, the second hole 106*b* is disposed away from the first hole 106*a* in a second distance D2. In some embodiments, the second distance D2 is a distance between a center of one of the first holes 106*a* and a center of one of the second holes 106*b*. In some embodiments, the second distance D2 is substantially less than the first distance D1. In some embodiments, the second distance D2 is about 0.5 to about 0.75 of the first distance D1.

In some embodiments, the second conductive pads 105*b* are disposed adjacent to one of the first conductive pads 105*a*. In some embodiments, the first conductive pad 105*a* is disposed between at least two of the second conductive pads 105*b*. In some embodiments, the first conductive pads 105*a* are spaced from each other in the first distance D1. In some embodiments, the second conductive pad 105*b* is disposed away from the first conductive pad 105*a* in the second distance D2. In some embodiments, the second distance D2 is substantially less than the first distance D1. In some embodiments, the second distance D2 is about 0.5 to about 0.75 of the first distance D1.

Figure 12:
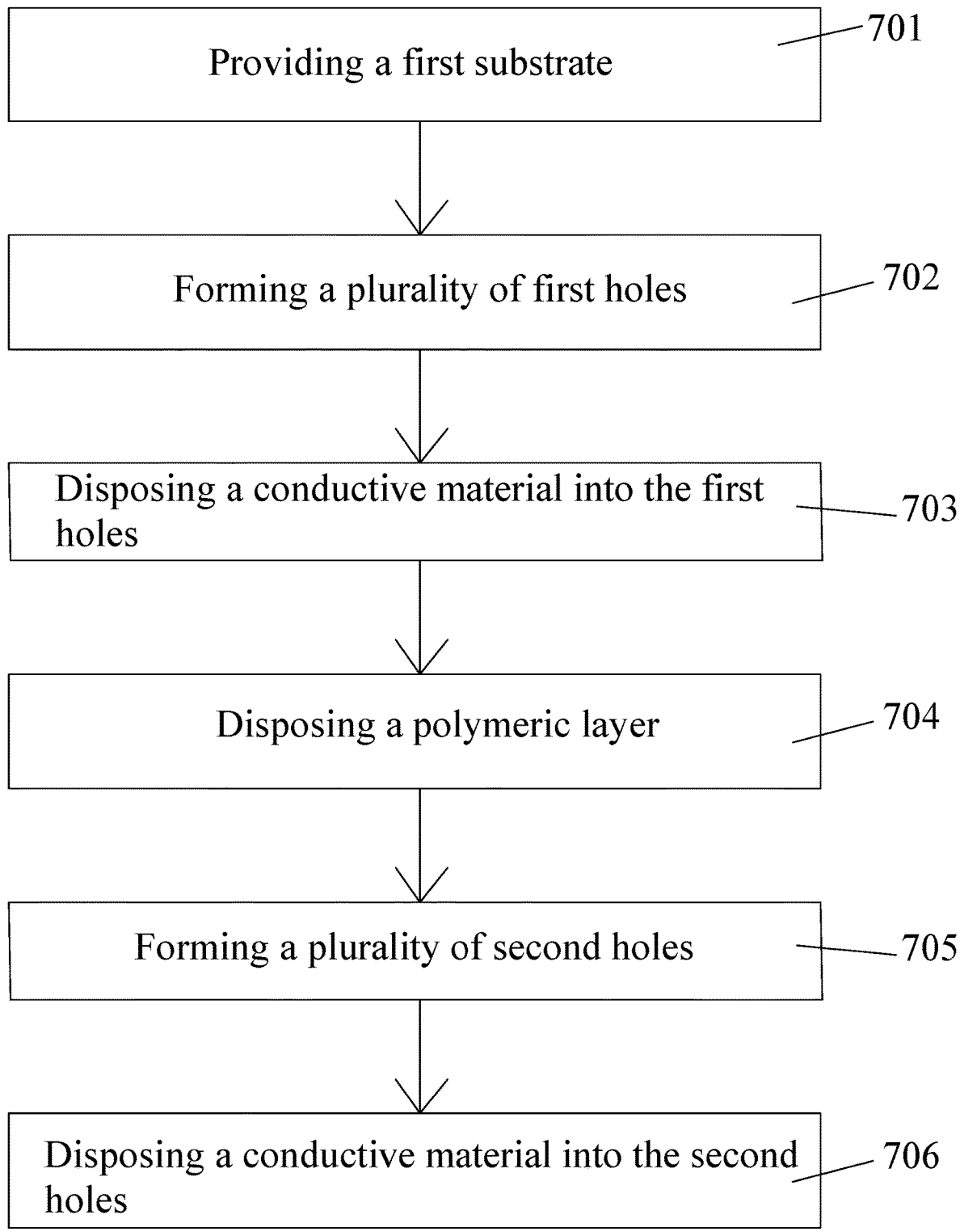
FIG. 12 is a flow diagram of a method of manufacturing a semiconductor structure in accordance with some embodiments of the present disclosure.

In some embodiments, a semiconductor structure is formed by a method 700. The method 700 includes a number of operations and the description and illustration are not deemed as a limitation as the sequence of the operations. FIG. 12 is an embodiment of the method 700 of manufacturing a semiconductor structure. The method 700 includes a number of operations (701, 702, 703, 704, 705 and 706).

Figure 12A:
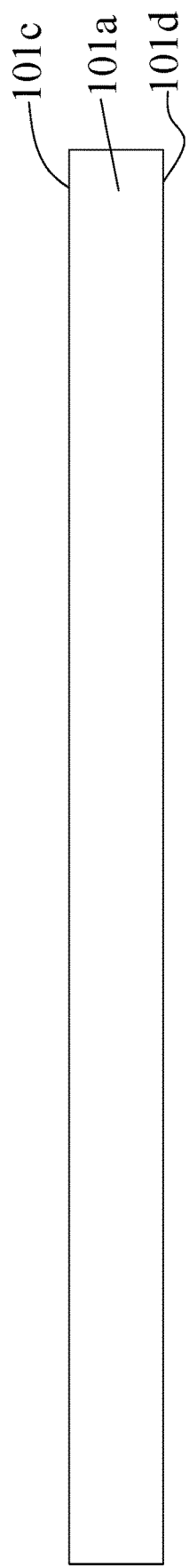

In operation 701, a first substrate 101*a* is provided as shown in FIG. 12A. In some embodiments, the first substrate 101*a* includes a first surface 101*c* and a second surface 101*d* opposite to the first surface 101*c*. In some embodiments, the first substrate 101*a* has similar configurations as the one described above or shown in FIGS. 9-10.

Figure 12B:
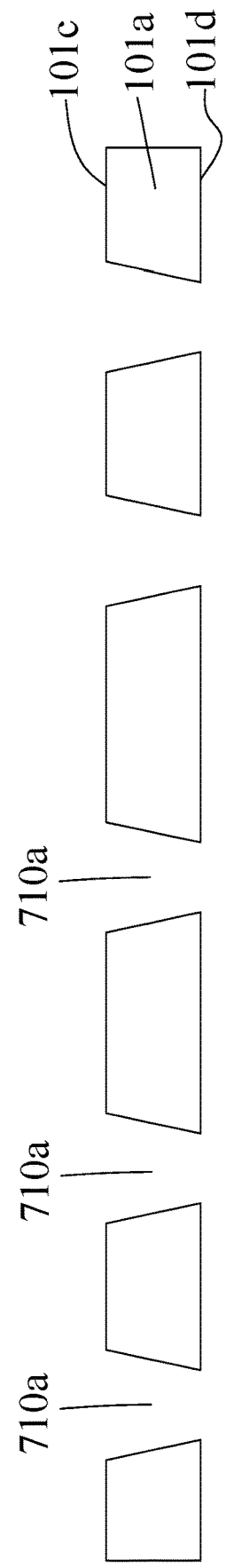

In operation 702, several first holes 710*a* are formed as shown in FIG. 12B. In some embodiments, the first holes 710*a* are formed by removing some portions of the first substrate 101*a*. In some embodiments, the first hole 710*a* is extended through the first substrate 101*a*. In some embodiments, the first hole 710*a* is formed by photolithography, etching or any other suitable operations.

In operation 703, a conductive material is disposed into the first holes 710a to form first vias 504-1 of conductive vias 504 as shown in FIG. 12C. In some embodiments, the first via 504-1 is extended through the first substrate 101a. In some embodiments, the first via 504-1 is part of the conductive via 504. In some embodiments, the conductive via 504 is separately formed by more than one operations. In some embodiments, conductive pads 505 are formed at both ends of the first via 504-1 of the conductive via 504 by disposing the conductive material over the first substrate 101a. In some embodiments, the conductive pads 505 are electrically coupled with the first via 504-1. In some embodiments, the conductive pad 505 is disposed over the first surface 101c or the second surface 101d of the first substrate 101a. In some embodiments, the conductive material is disposed by sputtering, electroplating or any other suitable operations. In some embodiments, the conductive material includes gold, silver, copper, nickel, tungsten, aluminum, titanium, palladium and/or alloys thereof.

In operation 704, a polymeric layer 102 is disposed over the first substrate 101a as shown in FIG. 12D. In some embodiments, the polymeric layer 102 is disposed over the second surface 101d of the first substrate 101a to cover the conductive pads 505. In some embodiments, the polymeric layer 102 is disposed by spin coating, chemical vapor deposition (CVD) or any other suitable operations.

Figure 12E:
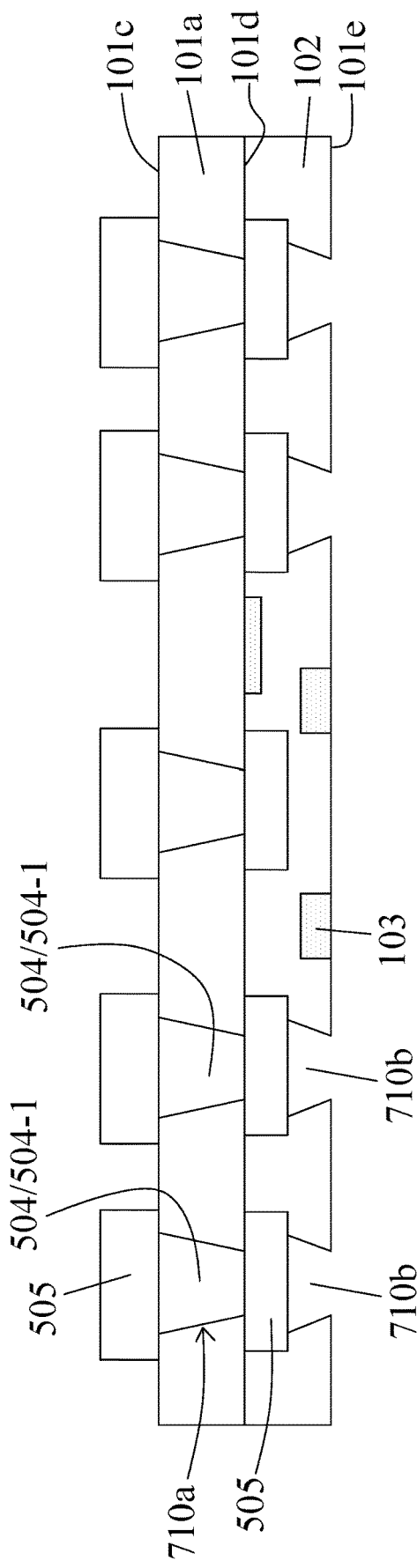

In operation 705, several second holes 710b are formed as shown in FIG. 12E. In some embodiments, some portions of the polymeric layer 102 are removed to form several second holes 710b. In some embodiments, a portion of the conductive pad 505 disposed over the second surface 101d of the first substrate 101a is exposed from the polymeric layer 102 by the second hole 710b. In some embodiments, the second hole 710b is extended through the polymeric layer 102. In some embodiments, the second hole 710b is formed by photolithography, etching or any other suitable operations.

Figure 12F:
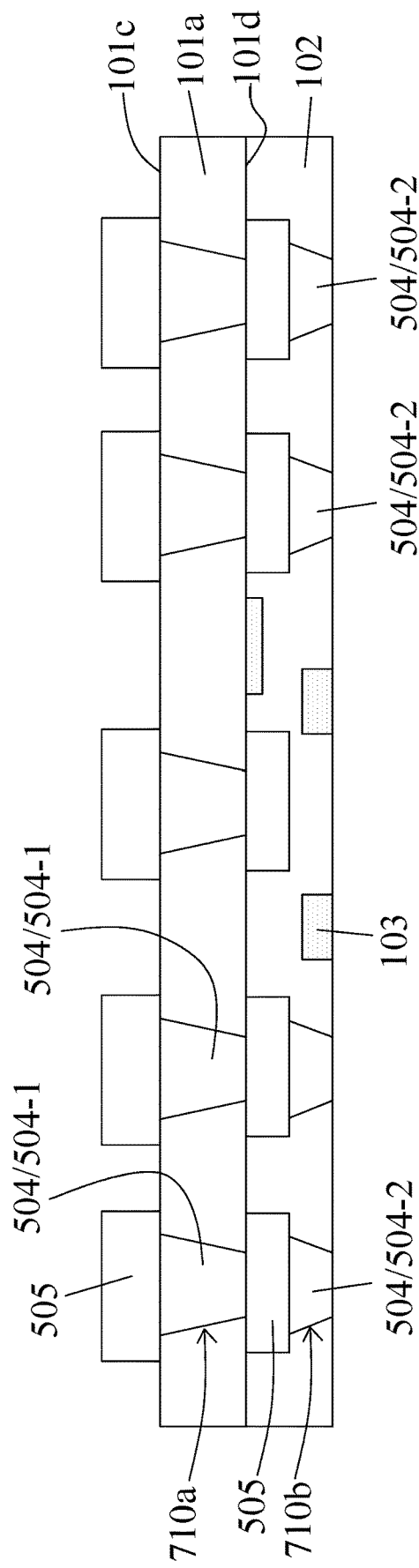

In operation 706, a conductive material is disposed into the second holes 710b to form second vias 504-2 of the conductive vias 504 as shown in FIG. 12F. In some embodiments, the second via 504-2 is extended through the polymeric layer 102. In some embodiments, the second via 504-2 is part of the conductive via 504. In some embodiments, the conductive via 504 is separately formed by more than one operations. In some embodiments, the conductive via 504 including the first via 504-1 and the second via 504-2 is formed. In some embodiments, the conductive via 504 is stacked vias. In some embodiments, the first via 504-1 and the second via 504-2 are separately formed. In some embodiments, the conductive material is disposed by sputtering, electroplating or any other suitable operations. In some embodiments, the conductive material includes gold, silver, copper, nickel, tungsten, aluminum, titanium, palladium and/or alloys thereof.

Figure 12G:
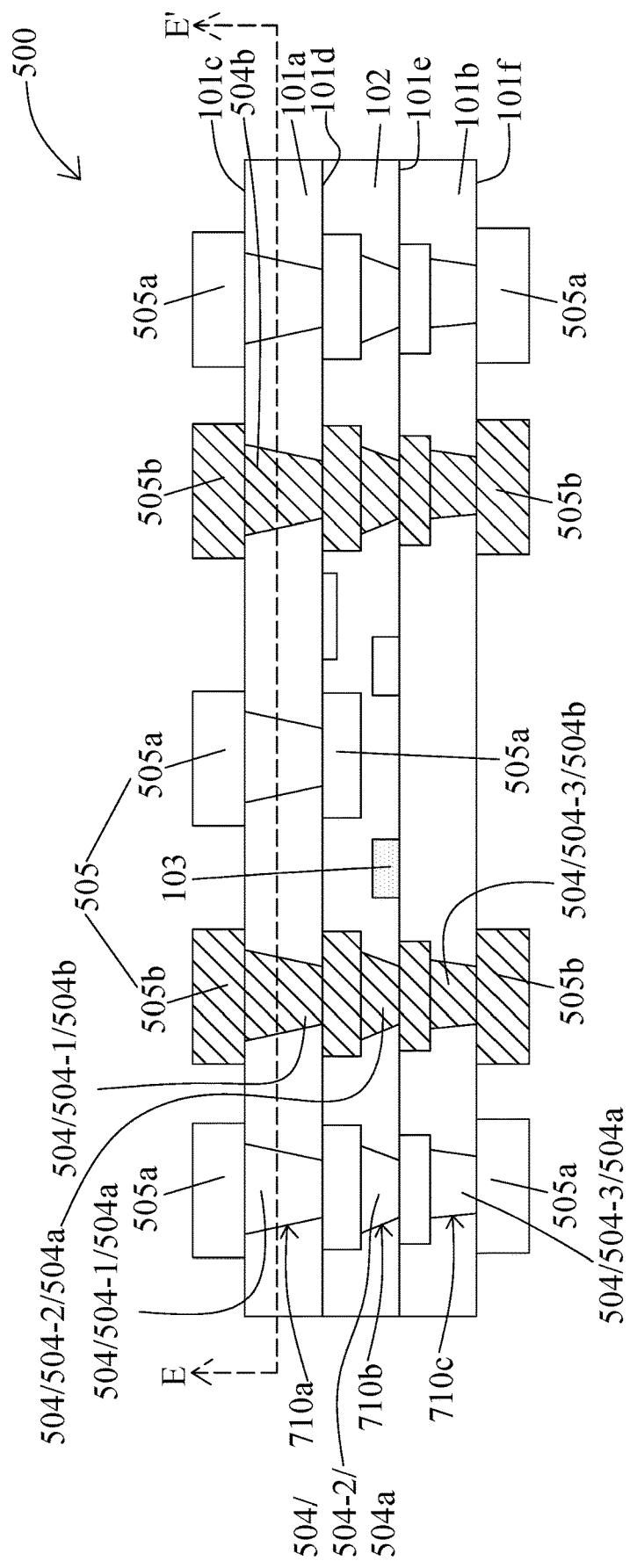

In some embodiments, a second substrate 101b is disposed over the polymeric layer 102 as shown in FIG. 12G. In some embodiments, the second substrate 101b includes a third surface 101e and a fourth surface 101f opposite to the third surface 101e. In some embodiments, the second substrate 101b has similar configurations as the one described above or shown in FIGS. 9-10. In some embodiments, some portions of the second substrate 101b are removed to form several third holes 710c as shown in FIG. 12G. In some embodiments, the third holes 710c are formed in a way similar to the operation 702.

In some embodiments, a conductive material is disposed into the third holes 710c to form third vias 504-3 of the conductive vias 504 as shown in FIG. 12G. In some embodiments, the third vias 504-3 are formed in a way similar to the operation 703. In some embodiments, the third via 504-3 is extended through the second substrate 101b. In some embodiments, the third via 504-3 is part of the conductive via 504. In some embodiments, the conductive via 504 is separately formed by more than one operations. In some embodiments, the conductive via 504 includes the first via 504-1, the second via 504-2 and the third via 504-3. In some embodiments, the first via 504-1, the second via 504-2 and the third via 504-3 are separately formed.

In some embodiments, conductive pads 505 are formed at an end of the third via 504-3 of the conductive via 504 by disposing the conductive material over the second substrate 101b. In some embodiments, the conductive pad 505 is disposed over the fourth surface 101f of the second substrate 101b. In some embodiments, the conductive via 504 including the first via 504-1, the second via 504-2 and the third via 504-3 is formed. In some embodiments, the conductive via 504 is stacked vias. In some embodiments, the first via 504-1, the second via 504-2 and the third via 504-3 are stacked over each other. In some embodiments, the first via 504-1, the second via 504-2 and the third via 504-3 are separately formed. In some embodiments, the conductive via 504 is formed by more than one operations. In some embodiments, a semiconductor structure 500 as shown in FIGS. 9-10 is formed.

Figure 12H:
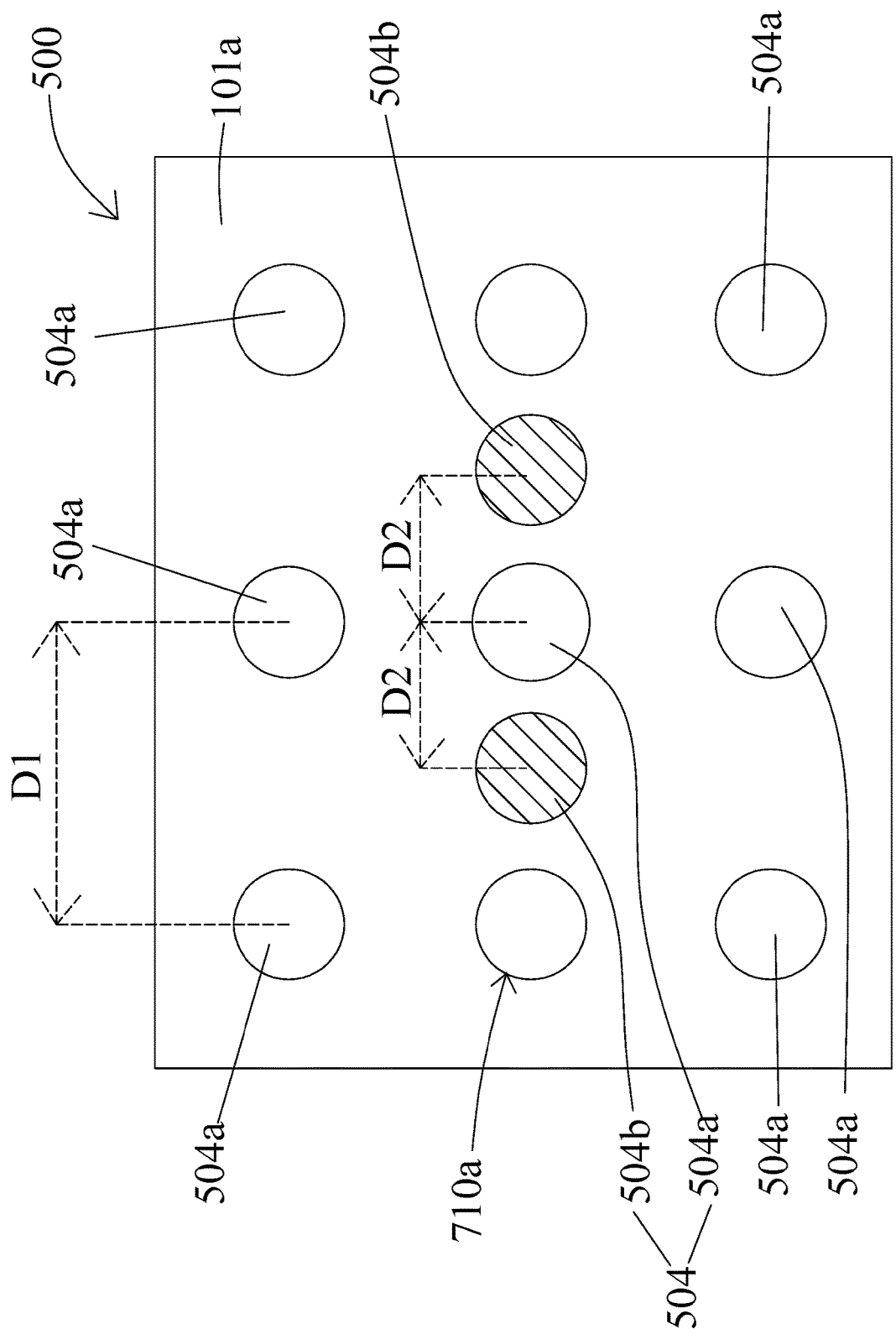

FIG. 12H is a schematic top cross sectional view of the semiconductor structure 500 along EE' in FIG. 12G. In some embodiments, the conductive vias 504 includes first conductive vias 504a and second conductive vias 504b. In some embodiments, the first conductive via 504a is configured to connect to a signal source, and the second conductive via 504b is configured to connect to an electrical ground. In some embodiments, the first holes 710a filled by the first vias 504-1 of the first conductive vias 504a are spaced from each other in a first distance D1. In some embodiments, the first distance D1 is a distance between two centers of adjacent first holes 710a filled by the first vias 504-1 of the first conductive vias 504a. In some embodiments, the first hole 710a filled by the first via 504-1 of the second conductive via 504b is disposed away from the first holes 710a filled by the first vias 504-1 of the first conductive vias 504a in a second distance D2. In some embodiments, the second distance D2 is a distance between a center of the first hole 710a filled by the first via 504-1 of the second conductive via 504b and a center of the first hole 710a filled by the first via 504-1 of the first conductive via 504a. In some embodiments, the second distance D2 is substantially less than the first distance D1. In some embodiments, the second distance D2 is about 0.5 to about 0.75 of the first distance D1.

In the present disclosure, a semiconductor structure is disclosed. The semiconductor structure includes several substrates, a polymeric layer disposed between the substrates, and several conductive vias vertically extended through the substrates and the polymeric layer. Some of the conductive vias are configured to connect to a signal source such as an input/output terminal or a node, and some of them are configured to connect to an electrical ground. Those conductive vias configured to connect to a signal source are surrounded by at least two conductive vias configured to connect to an electrical ground. As a result, signal noise generated from adjacent conductive vias connected to the signal source can be minimized or prevented.

In some embodiments, a semiconductor structure includes a first substrate including a first surface and a second surface opposite to the first surface; a second substrate including a third surface and a fourth surface opposite to the third surface; a polymeric layer disposed between the second surface of the first substrate and the third surface of the second substrate; a conductive line embedded in the polymeric layer; a first conductive via extended through the first substrate, the second substrate and the polymeric layer; a second conductive via extended through the first substrate, the second substrate and the polymeric layer; and a third conductive via extended through the first substrate, the second substrate and the polymeric layer, wherein the second conductive via is disposed between the first conductive via and the third conductive via, the second conductive via is configured to connect to a signal source, and the first conductive via and the third conductive via are configured to connect to an electrical ground.

In some embodiments, the first conductive via, the second conductive via and the third conductive via are substantially orthogonal to the conductive line. In some embodiments, the conductive line is extended over and along the first surface of the first substrate or the third surface of the second substrate. In some embodiments, the semiconductor structure further includes a first conductive pad disposed over the first surface of the first substrate and coupled with the first conductive via, a second conductive pad disposed over the first surface of the first substrate and coupled with the second conductive via, and a third conductive pad disposed over the first surface of the first substrate and coupled with the third conductive via, the first conductive pad, the second conductive pad and the third conductive pad are exposed from the first substrate. In some embodiments, the first conductive via, the second conductive via and the third conductive via are linearly aligned with each other. In some embodiments, the first conductive pad, the second conductive pad and the third conductive pad are linearly aligned with each other.

In some embodiments, the semiconductor structure further includes a fourth conductive pad disposed over the fourth surface of the second substrate and coupled with the first conductive via; a fifth conductive pad disposed over the fourth surface of the second substrate and coupled with the second conductive via; and a sixth conductive pad disposed over the fourth surface of the second substrate and coupled with the third conductive via, wherein the fourth conductive pad, the fifth conductive pad and the sixth conductive pad are exposed from the second substrate. In some embodiments, the fourth conductive pad, the fifth conductive pad and the sixth conductive pad are linearly aligned with each other. In some embodiments, a first width of the first conductive via is uniform between the first conductive pad and the fourth conductive pad, a second width of the second conductive via is uniform between the second conductive pad and the fifth conductive pad, and a third width of the third conductive via is uniform between the third conductive pad and the sixth conductive pad. In some embodiments, the polymeric layer includes prepreg, resin or epoxy. In some embodiments, the first substrate or the second substrate includes fiberglass.

In some embodiments, a semiconductor structure includes a first substrate including a first surface and a second surface opposite to the first surface; a second substrate including a third surface and a fourth surface opposite to the third surface; a polymeric layer disposed between the second surface of the first substrate and the third surface of the second substrate; a conductive line embedded in the polymeric layer; a plurality of first conductive vias extending through the first substrate, the polymeric layer and the second substrate, the plurality of first conductive vias configured to connect to a signal source and spaced from each other by a first distance; and a plurality of second conductive vias extended through the first substrate, the polymeric layer and the second substrate, the plurality of second conductive vias configured to connect to an electrical ground and each spaced from one of the plurality of first conductive vias by a second distance smaller than the first distance, wherein each of the plurality of first conductive vias is separated from another of the plurality of first conductive via by one of the plurality of second conductive via.

In some embodiments, the second distance is about 0.5 to about 0.75 of the first distance. In some embodiments, the plurality of first conductive vias and the plurality of second conductive vias are substantially orthogonal to the conductive line. In some embodiments, the plurality of first conductive vias and the plurality of second conductive vias are plated through hole (PTH). In some embodiments, the semiconductor structure further includes a plurality of first conductive pads disposed over the first surface of the first substrate and coupled with the plurality of first conductive vias respectively; and a plurality of second conductive pads disposed over the first surface of the first substrate and coupled with the plurality of second conductive vias respectively, wherein the plurality of first conductive pads are substantially coplanar with the plurality of the second conductive pads.

In some embodiments, a semiconductor structure, includes a first substrate including a first surface and a second surface opposite to the first surface; a second substrate including a third surface and a fourth surface opposite to the third surface; a polymeric layer disposed between the second surface of the first substrate and the third surface of the second substrate; a conductive line embedded in the polymeric layer; a first conductive via including a first via and a second via; a second conductive via including a third via and a fourth via; and a third conductive via including a fifth via and a sixth via, wherein the first via is disposed over the second via, the third via is disposed over the fourth via, the fifth via is disposed over the sixth via, the first via, the third via and the fifth via are respectively extended through the first substrate or the second substrate, the second via, the fourth via and the sixth via are respectively extended through the polymeric layer, the second conductive via is disposed between the first conductive via and the third conductive via, the second conductive via is configured to connect to a signal source, and the first conductive via and the third conductive via are configured to connect to an electrical ground.

In some embodiments, the first via is separated from the second via, the third via is separated from the fourth via, and the fifth via is separated from the sixth via. In some embodiments, the semiconductor structure further includes a first conductive pad disposed between the first via and the second via and embedded in the polymeric layer or the second substrate; a second conductive pad disposed between the third via and the fourth via and embedded in the polymeric layer or the second substrate; a third conductive pad disposed between the fifth via and the sixth via and embedded in the polymeric layer or the second substrate. In some embodiments, the first conductive pad and the third conductive pad are configured to connect to the electrical ground, and the second conductive pad is configured to connect to the signal source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first substrate including a first surface and a second surface opposite to the first surface;
a polymeric layer extended over the first surface or the second surface of the first substrate;
a conductive line extended within the polymeric layer;
a first conductive via extended through the first substrate;
a second conductive via extended through the first substrate; and
a third conductive via extended through the first substrate, wherein the second conductive via is disposed between the first conductive via and the third conductive via, the second conductive via is configured to connect to a signal source, and the first conductive via and the third conductive via are configured to connect to an electrical ground.

2. The semiconductor structure of claim 1, wherein the first conductive via, the second conductive via and the third conductive via are linearly aligned with each other.

3. The semiconductor structure of claim 1,
wherein the first conductive via is extended through the first substrate and the polymeric layer, the second conductive via is extended through the first substrate and the polymeric layer, and the third conductive via is extended through the first substrate and the polymeric layer.

4. The semiconductor structure of claim 3, wherein the polymeric layer includes prepreg, resin or epoxy.

5. The semiconductor structure of claim 1, wherein the conductive line is electrically connected to the signal source or is coupled with the second conductive via.

6. The semiconductor structure of claim 1, wherein the conductive line is electrically connected to the electrical ground or is coupled to the first conductive via or the third conductive via.

7. The semiconductor structure of claim 1, wherein the first conductive via, the second conductive via and the third conductive via are substantially orthogonal to the conductive line.

8. The semiconductor structure of claim 1, further comprising:
a first conductive pad disposed over the first surface of the first substrate and coupled with the first conductive via;
a second conductive pad disposed over the first surface of the first substrate and coupled with the second conductive via; and
a third conductive pad disposed over the first surface of the first substrate and coupled with the third conductive via,
wherein the first conductive pad, the second conductive pad and the third conductive pad are exposed from the first substrate.

9. The semiconductor structure of claim 8, wherein the first conductive pad, the second conductive pad and the third conductive pad are linearly aligned with each other.

10. The semiconductor structure of claim 8, further comprising:
a fourth conductive pad disposed opposite to the first conductive pad and coupled with the first conductive via;
a fifth conductive pad disposed opposite to the second conductive pad and coupled with the second conductive via; and
a sixth conductive pad disposed opposite to the third conductive pad and coupled with the third conductive via,
wherein the fourth conductive pad, the fifth conductive pad and the sixth conductive pad are vertically aligned with the first conductive pad, the second conductive pad and the third conductive pad respectively.

11. The semiconductor structure of claim 1, wherein the first substrate includes fiberglass.

12. A semiconductor structure, comprising:
a first substrate including a first surface and a second surface opposite to the first surface;
a plurality of first conductive vias extending through the first substrate, configured to connect to a signal source and spaced from each other by a first distance; and
a plurality of second conductive vias extended through the first substrate to connect to an electrical ground, each of the plurality of second conductive vias is spaced from one of the plurality of first conductive vias by a second distance smaller than the first distance.

13. The semiconductor structure of claim 12, wherein the second distance is about 0.5 to about 0.75 of the first distance.

14. The semiconductor structure of claim 12, wherein one of the plurality of second conductive vias is disposed between two of the plurality of first conductive vias.

15. The semiconductor structure of claim 12, wherein the plurality of first conductive vias and the plurality of second conductive vias are plated through hole (PTH).

16. The semiconductor structure of claim 12, further comprising:
a plurality of first conductive pads disposed over the first surface of the first substrate and coupled with the plurality of first conductive vias respectively; and
a plurality of second conductive pads disposed over the first surface of the first substrate and coupled with the plurality of second conductive vias respectively,
wherein the plurality of first conductive pads are substantially coplanar with the plurality of the second conductive pads.

17. A semiconductor structure, comprising:
a first substrate including a first surface and a second surface opposite to the first surface;
a first conductive via including a first via and a second via;
a second conductive via including a third via and a fourth via; and
a third conductive via including a fifth via and a sixth via,
wherein the first via is disposed over the second via, the third via is disposed over the fourth via, the fifth via is disposed over the sixth via, the first via, the third via and the fifth via are respectively extended through the first substrate, the second conductive via is disposed between the first conductive via and the third conductive via.

18. The semiconductor structure of claim 17, wherein the first via is separated from the second via, the third via is separated from the fourth via, and the fifth via is separated from the sixth via.

19. The semiconductor structure of claim 17, further comprising a conductive line disposed between the second via and the fourth via or between the fourth via and the sixth via.

20. The semiconductor structure of claim 17, further comprising:

a first conductive pad disposed between the first via and the second via;
a second conductive pad disposed between the third via and the fourth via;
a third conductive pad disposed between the fifth via and the sixth via,
wherein the first conductive pad and the third conductive pad are configured to connect to an electrical ground, and the second conductive pad is configured to connect to a signal source.

* * * * *